United States Patent
Saito et al.

(10) Patent No.: US 6,919,734 B2
(45) Date of Patent: Jul. 19, 2005

(54) COOLING FIN CONNECTED TO A COOLING UNIT AND A PUSHER OF THE TESTING APPARATUS

(75) Inventors: Noboru Saito, Tokyo (JP); Hiroyuki Takahashi, Tokyo (JP); Noriyuki Igarashi, Tokyo (JP); Keiichi Fukumoto, Tokyo (JP); Hiroto Nakamura, Tokyo (JP); Yutaka Watanabe, Tokyo (JP); Kenichi Shimada, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/716,613

(22) Filed: Nov. 20, 2003

(65) Prior Publication Data

US 2004/0070416 A1 Apr. 15, 2004

Related U.S. Application Data

(60) Continuation of application No. 10/121,592, filed on Apr. 15, 2002, now abandoned, which is a division of application No. 09/448,303, filed on Nov. 24, 1999, now abandoned.

(30) Foreign Application Priority Data

| Nov. 25, 1998 | (JP) | .......................................... | 10-333864 |
| Dec. 10, 1998 | (JP) | .......................................... | 10-351357 |
| Dec. 22, 1998 | (JP) | .......................................... | 10-364356 |

(51) Int. Cl.[7] .................... G01R 31/02; G01R 31/26
(52) U.S. Cl. ...................................... 324/760; 324/754
(58) Field of Search .................... 324/760, 765, 324/158.1, 754–758

(56) References Cited

U.S. PATENT DOCUMENTS

| 5,172,049 A | 12/1992 | Kiyokawa et al. |
| 5,475,317 A | 12/1995 | Smith |
| 5,748,007 A | 5/1998 | Gaschke |
| 5,903,163 A | 5/1999 | Tverdy et al. |
| 5,907,246 A | 5/1999 | Abraham et al. |

FOREIGN PATENT DOCUMENTS

| JP | 06-034706 | 10/1994 |
| JP | 10 288646 | 10/1998 |

*Primary Examiner*—Paresh Patel
(74) *Attorney, Agent, or Firm*—Birch, Stewart, Kolasch & Birch, LLP

(57) ABSTRACT

A device testing apparatus including a connection terminal to which an electronic device under test is detachably attached, a pusher for pushing the electronic device in the direction of the connection terminal so as to connect the electronic device to the connection terminal, and a cooling unit for cooling the electronic device. As the cooling unit, an element cooling the device using electricity is for example used. The cooling unit includes a cooling medium blower for blowing a cooling medium around the electronic device and heat exchange projections or depressions for raising the cooling efficiency by blowing a cooling medium. In the device testing apparatus, even if the electronic device generates heat on its own during testing, the electronic device is cooled through the pusher, connection terminals, or socket, so the effect of the heat generated by the electronic device is canceled out and the electronic device can be tested at the predetermined temperature as prescribed in the specification.

7 Claims, 28 Drawing Sheets

FIG. 16
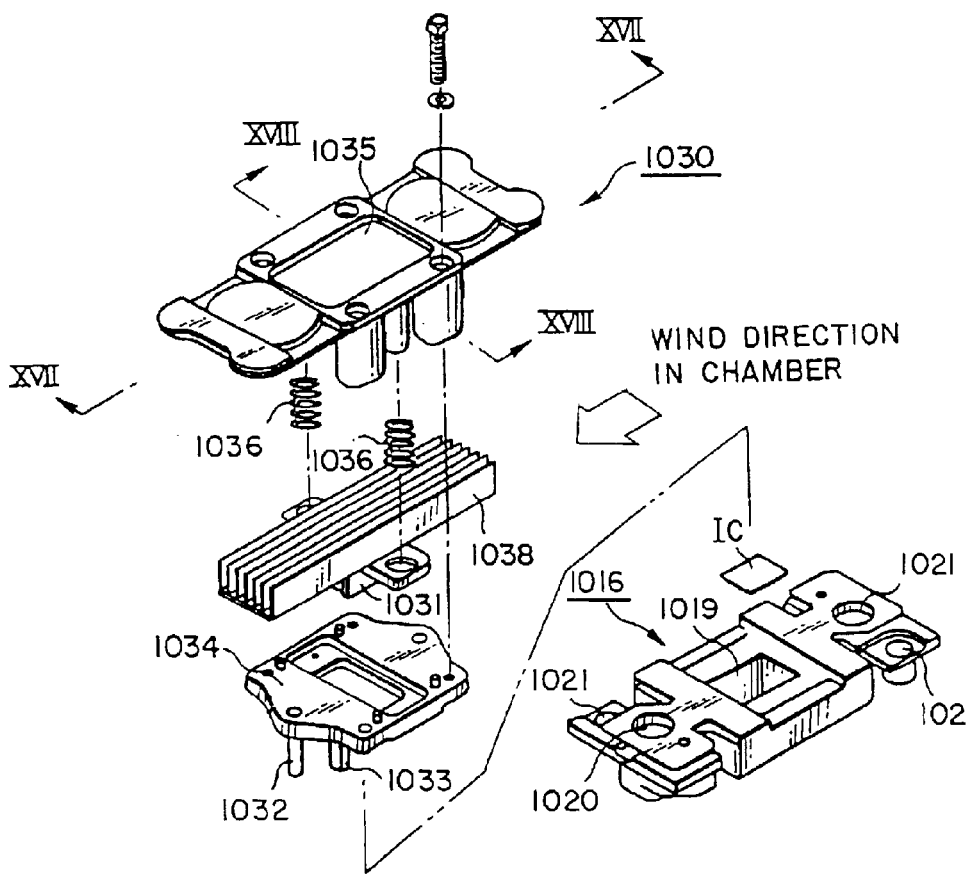
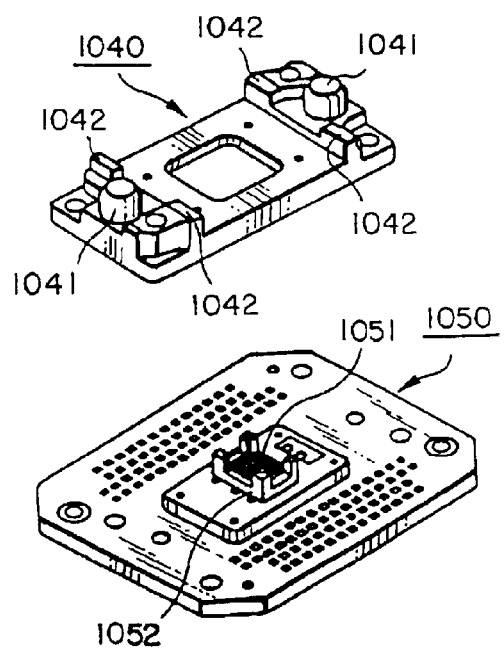

COOLING FIN CONNECTED TO A COOLING UNIT AND A PUSHER OF THE TESTING APPARATUS

This application is a continuation of application Ser. No. 10/121,592, filed on Apr. 15, 2002 abandoned, which is a divisional of application Ser. No. 09/448,303, filed on Nov. 24, 1999, now abandoned, the entire contents of which are hereby incorporated by reference and for which priority is claimed under 35 U.S.C. §120; and this application claims priority of Application Nos. 10-333,864 filed in Japan on Nov. 25, 1998, 10-364,356 filed in Japan on Dec. 22, 1998, and 10-351,357 filed in Japan on Dec. 10, 1998 under 35 U.S.C. §119.

BACKGROUND OF THE INVENTION

1. Field of the Invention

The present invention relates to a device testing apparatus for testing IC chips and other electronic devices at a predetermined temperature, more particularly relates to a device testing apparatus which accurately controls the temperature of the electronic devices even if the electronic devices generate heat on their own during the testing and thereby enables the electronic devices to be tested at the desired test temperature.

2. Description of the Related Art

In the process of production of a semiconductor device etc., a tester is necessary for testing the finally produced IC chip or other device. As one type of such a tester, there is known an apparatus for testing an IC chip at high temperature, ordinary temperature or temperature conditions lower than ordinary temperature. This is because it is guaranteed as one of the features of an IC chip that it operate well as high temperature, ordinary temperature, or low temperature.

In such a tester, the top of the test head is covered by a chamber, the inside is made an air-tight space, an IC chip is coveyed on to the test head, the IC chip is pushed against the test head for connection, and the IC chip is tested while maintaining the inside of the chamber at a certain temperature range. This type of test is used to test IC chips well and sort them into at least good chips and defective chips.

Along with the increasingly higher speeds and increasingly higher integration densities of IC chips in recent years, the heat generated by the chips themselves at the time of operation becomes larger. Such heat is generated at the time of testing IC chips as well. Even if the inside of the chamber is maintained at a constant temperature, it is therefore be difficult to test IC chips at the intended test temperature. For example, as much of 30 watts of heat is sometimes generated depending on the type of the IC chip. In this way, when testing IC chips generating large heat, no matter how much effort is made to hold the inside of the chamber at a constant temperature, it becomes difficult to test the IC chips in a prescribed range of test temperature. When unable to test IC chips at the prescribed test temperature, there is the problem that the reliability of the tests ends up falling.

Recently, therefore, effort has been made to develop testing apparatuses with temperature sensors attached to the suction heads for picking up and holding the IC chips and pressing and holding them against the sockets of the test heads, measuring the temperature of the IC chips at the time of the tests, and blowing cooling air when the IC chips rise to more than a set temperature due to the heat they generate.

Some types of testing apparatuses, however, have the suction heads attached to rotary arms which rotate along an infinite path. In testers where the suction heads move in this manner, there is the problem that when attaching temperature sensors to the suction heads, the electrical wiring from the temperature sensors becomes complicated. If the electrical wiring from the temperature sensors is formed by ordinary electrical wiring, the electrical wiring will become twisted along with the rotation of the rotary arm, so it is necessary to use rotary joints or other special connectors in the middle of the electrical wiring. Accordingly, the testing apparatus become higher in price and the problem occurs of rotational wear at the rotary joints of the electrical wiring and of a decline in the durability.

Further, in the worst case, the cables of the temperature sensors are liable to break due to movement of the suction heads. Further, in a structure using suction passages of the suction heads to blow cooling air to the IC chips, it is not possible to blow a sufficient amount of cooling air to the IC chips and therefore not possible to deal with cases of a large amount of heat generated.

SUMMARY OF THE INVENTION

An object of the present invention is to provide a device testing apparatus able to accurately control the temperature of electronic devices and test the electronic devices at a desired test temperature even if the electronic devices generate heat on their own at the time of testing. Another object of the present invention is the provision of a device testing apparatus able to apply a uniform temperature to a large number of electronic devices in a short time.

To achieve the objects of the present invention, according to a first aspect of the present invention, there is provided a device testing apparatus comprising a connection terminal to which an electronic device under test is detachably connected; a pusher for pushing the electronic device in the direction of the connection terminal so as to connect the electronic device to the connection terminal; and a cooling unit attached to the pusher for cooling the electronic device.

According to a second aspect of the present invention, there is provided a device testing apparatus comprising a connection terminal to which an electronic device under test is detachably connected and a cooling unit for directly or indirectly cooling the connection terminal.

According to a third aspect of the present invention, there is provide a device testing apparatus comprising a socket having a connection terminal to which an electronic device under test is detachably connected and a cooling unit for directly or indirectly cooling the socket.

Preferably, the cooling unit includes an element for cooling by electricity.

Alternatively, preferably, the cooling unit includes a cooling medium blowing means for blowing a cooling medium around the electronic device.

Alternatively, preferably, the cooling unit includes projections or depressions for heat exchange for increasing the cooling efficiency by blowing a cooling medium. The projections or depressions for heat exchange are not particularly limited, but are preferably heat absorbing and radiating members. As the heat absorbing and radiating members, for example heat radiating fins may be mentioned.

In the device testing apparatus according to the first to third aspects of the present invention, even if an electronic device generates heat on its own at the time of testing, the electronic device is cooled through the pusher, connection terminal, or socket, so the effect of heat generated by the electronic device is canceled out and it is possible to test an electronic device at a predetermined temperature as stipulated in the specifications.

Note that when testing an electronic device at ordinary temperature, it is possible to eliminate the test chamber. When testing the electronic device at a low temperature, however, if just holding the electronic device in a low temperature state, condensation sometimes becomes a problem, so it is desirable to use a test chamber to cover the area around the connection terminals to which the electronic device is detachably connected. Further, when testing an electronic device at a high temperature, the present invention is effective from the viewpoint of control of the temperature of the electronic device so that it does not exceed a predetermined temperature.

According to a fourth aspect of the present invention, there is provided a device testing apparatus comprising a socket having a connection terminal to which an electric device under test is detachably connected; a pusher for contacting a first surface of an electronic device and pushing the electronic device in the direction of the connection terminal so as to connect the electronic device to the connection terminals; a temperature sensor arranged at the socket side for measuring the temperature of a second surface of the electronic device at a side opposite to the first surface; and a cooling medium blowing means for blowing a cooling medium around the electronic device.

The temperature sensor is not particularly limited and may be any of a thermocouple, thermistor, or other contact-type temperature sensor for detecting temperature in contact with a portion to be measured for temperature or a radiation thermometer or other non-contact type temperature sensor using infrared rays or the like to be able to detect temperature by a non-contact method.

According to a fifth aspect of the present invention, there is provided a device testing apparatus comprising a socket having a connection terminal to which an electronic device under test is detachably connected; a pusher for contacting a first surface of the electronic device and pushing the electronic device in the direction of the connection terminals so as to connect the electronic device to the connection terminal; and a cooling medium blowing means arranged at the socket side for blowing a cooling medium to a second surface of the electronic device at the side opposite to the first surface.

According to a sixth aspect of the present invention, there is provided a device testing apparatus comprising a socket having a connection terminal to which an electronic device under test is detachably connected; a pusher for pushing the electronic device in the direction of the connection terminals so as to connect the electronic device to the connection terminal; and a cooling medium blowing means arranged at the outer circumference of the pusher for blowing a cooling medium to a side surface of the pusher.

In this case, preferably projections or depressions are formed at the outer circumferential surface of the pusher for increasing the heat exchange efficiency.

According to a seventh aspect of the present invention, there is provided a device testing apparatus comprising a socket having a connection terminal to which an electronic device under test is detachably connected; a pusher for contacting-a first surface of the electronic device and pushing the electronic device in the direction of the connection terminal so as to connect the electronic device to the connection terminals; a non-contact type temperature sensor arranged at the pusher side for measuring a temperature of a first surface of the electronic device; and a cooling medium blowing means for blowing a cooling medium around the electronic device.

According to an eighth aspect of the present invention, there is provided a device testing apparatus comprising a socket having connection terminals to which an electronic device under test is detachably connected; a pusher for pushing the electronic device in the direction of the connection terminals so as to connect the electronic device to the connection terminals; a non-contact type temperature sensor arranged at the pusher side for measuring a temperature of the pusher; and a cooling medium blowing means for blowing a cooling medium around the electronic device.

In the device testing apparatuses according to the fourth to eighth aspects of the present invention, the pusher is not particularly limited, but the effect of the present invention is larger when it has a pickup nozzle attached under a suction head, the suction head is attached to a rotary arm, and the rotary arm is rotatably attached to a shaft.

In the device testing apparatuses according to the fourth to eighth aspects of the present invention, even when the electronic device generates heat on its own at the time of testing, the temperature rise of the electronic device is detected by the temperature sensor and, when the electronic device rises in temperature more than necessary, a cooling medium is blown on to the electronic device directly or to the pusher to thereby cool the electronic device. Accordingly, the effect of the heat generated by the electronic device is canceled and the electronic device can be tested at a predetermined temperature as prescribed in the specifications. Note that the cooling medium is preferably dry air cooled to a predetermined temperature. Dry air is preferable to prevent condensation in low temperature tests.

Note that when testing the electronic device at ordinary temperature, it is possible to eliminate the test chamber. When testing an electronic device at a low temperature, however, if just holding the electronic device in a low temperature state, condensation sometimes becomes a problem, so it is desirable to use a test chamber to cover the area around the connection terminals to which the electronic device is detachably connected. Further, when testing an electronic device at a high temperature, the present invention is effective from the viewpoint of control of the temperature of the electronic device so that it does not exceed a predetermined temperature.

In particular, in a device testing apparatus according to the fourth aspect of the present invention, the temperature sensor for detecting the temperature of the electronic device is arranged at the socket side. In a device testing apparatus having a rotary arm type suction head, the pusher attached to the suction head rotates, but the socket side differs from the rotatable pusher side in that it is secured to the top of the test head. Therefore, in the device testing apparatus according to the fourth aspect of the present invention, the electrical wiring from the temperature sensor is extremely easy and it is possible to avoid breakage of the cable from the temperature sensor and other situations.

Further, in a device testing apparatus having a rotary arm type suction head, a plurality of suction heads are generally arranged about the shaft. When attaching temperature sensors to the pushers attached to the suction heads, a number of temperature sensors equal to the number of pushers becomes necessary. As opposed to this, in the device testing apparatus according to the present invention, it is sufficient to provide a number of temperature sensors corresponding to the number of sockets to which the electronic devices are attached. It is therefore possible to reduce the number of temperature sensors.

In a device testing apparatus according to the fifth aspect of the present invention, a cooling medium is blown toward the back of the electronic device from the socket side to cancel out the temperature rise due to the heat generated by the electronic device and test the electronic device at the temperature as prescribed in the specification. In the related art, the general practice has been to blow a cooling medium from the top side (pusher side) of the electronic device to the area around the electronic device, but the electronic device cannot be said to have been sufficiently cooled. In the device testing apparatus according to the fifth aspect of the present invention, by directly blowing a cooling medium toward the back of the electronic device, it is possible to improve the cooling efficiency of the electronic device, cancel out the effect of the heat generated by the electronic device well, and test the electronic device at a predetermined temperature as prescribed in the specifications.

In the device testing apparatus according to a sixth aspect of the present invention, the cooling medium is blown to the side surface of the pusher. A variety of components are arranged around the socket used in the testing of the electronic device and it is often difficult to blow a cooling medium directly toward the electronic device. In the device testing apparatus according to the sixth aspect of the present invention, the cooling medium is blown toward the side surface of the pusher to cool the electronic device indirectly. At this time, by providing heat exchange fins or other projections or depressions at the outer circumference of the pusher, it is possible to increase the heat exchange efficiency, cool the pusher efficiently, and efficiently cool the electronic device indirectly. In the device testing apparatus according to the sixth aspect of the present invention as well, it is possible to cancel out the effect of the heat generated by the electronic device well and test the electronic device at a predetermined temperature as prescribed in the specifications.

In the device testing apparatus according to a seventh aspect of the present invention, the temperature of the pusher side surface of the electronic device is measured by a non-contact type temperature sensor. When the terminals of the electronic device are arranged over the entire back (second surface) of the electronic device, connection terminals are arranged without space between them at the socket as well. In such a case, it is difficult to measure the temperature of the electronic device from the socket side. In the device testing apparatus according to the seventh aspect of the present invention, the temperature of the pusher side surface of the electronic device is measured by a non-contact type temperature sensor.

If the non-contact type temperature sensor is used, there is no need to secure the pusher and there is no need to rotate it together with the pusher. Therefore, even if a device testing apparatus having a rotary arm type suction head, the electrical wiring from the temperature sensor does not become complicated. In the device testing apparatus according to the seventh aspect of the present invention, a non-contact type temperature sensor is used to accurately measure the temperature of the electronic device and a cooling medium is blown on the electronic device based on the measurement results to cool the electronic device. Therefore, it is possible to cancel out the effect of heat generated by the electronic device well and test the electronic device at a predetermined temperature as prescribed in the specifications.

In the device testing apparatus according to an eighth aspect of the present invention, the temperature of the pusher pushing the electronic device in the socket direction is measured by a non-contact type temperature sensor. A variety of components are arranged around the socket used in the testing of the electronic device and it is often difficult to directly measure the temperature from the pusher side surface (first surface) of the electronic device. In the device testing apparatus according to the eighth aspect of the present invention, the temperature of the electronic device is not measured directly. The temperature of the pusher is measured to estimate the temperature of the electronic device and detect the temperature rise due to the heat generated by the electronic device. Since the electronic device is in contact with the pusher, if the electronic device rises in temperature due to the heat it generates on its own, the pusher also rises in temperature. The temperature of the pusher and the temperature of the electronic device, however, do not always match, so in order to estimate the temperature of the electronic device from the detected temperature of the pusher, it is necessary to consider a correction value found by experiments etc. for the detected temperature of the pusher to estimate the temperature of the electronic device.

Further, in the device testing apparatus according to the eighth aspect of the present invention as well, since a non-contact type temperature sensor is used, there is no need to secure the temperature sensor to the pusher and no need to make it rotate along with the pusher. Therefore, even with a device testing apparatus having a rotary arm type suction head, the electrical wiring from the temperature sensor does not become complicated. Further, in the device testing apparatus according to the eighth aspect of the present invention, a non-contact type temperature sensor is used to measure the temperature of the pusher, the temperature of the electronic device is accurately predicted from the detected temperature, and, based on the results, a cooling medium is blown on the electronic device to cool the electronic device. Therefore, it is possible to cancel out the effect of heat generated by the electronic device well and test the electronic device at a predetermined temperature as prescribed in the specifications.

According to a ninth aspect of the present invention, there is provided a device testing apparatus comprising a pusher for holding or pushing an electronic device to make it approach or move away from a contact portion of a test head; a temperature sensor provided at the pusher; a first terminal of the temperature sensor provided at the pusher; and a second terminal provided at the contact portion side and contacting or not contacting the first terminal of the temperature sensor along with the movement of the pusher.

According to a 10th aspect of the present invention, there is provided a device testing apparatus comprising a pusher for holding or pushing an electronic device to make it approach or move away from a contact portion of a test head; a temperature sensor provided at the pusher; a first terminal of the temperature sensor provided at the pusher; a second terminal provided at the contact portion side and contacting or not contacting the first terminal of the temperature sensor along with the movement of the pusher; and an air blower unit for blowing cooling air to the electronic device in a state where the electronic device held by the pusher is pushed against the contact portion.

Preferably, at least one of the first terminal and second terminal is provided to be able to move in the direction of movement of the pusher.

Preferably the air blower unit is arranged around the contact portion.

Preferably the air blower unit has a cooling air passage through which cooling air is blown substantially horizontally to an electronic device pushed against the contact portion.

In the device testing apparatuses according to the ninth and 10th aspects of the present invention, the first terminal and second terminal contact each other at least when detection of the temperature by a temperature sensor is necessary. There is no need for connection by a cable etc. at other times and there is no longer a chance of the cable of the temperature sensor breaking along with movement of the pusher.

In particular, in the device testing apparatus according to the 10th aspect of the present invention, since an air blower unit is provided around the contact portion and cooling air is blown substantially horizontally to the electronic device, a sufficient amount of cooling air can be provided and, further, the electronic device as a whole is blown against evenly, so the cooling effect on the electronic device is increased and the effect of suppression of the rise of temperature due to the heat generated by the electronic device becomes more remarkable. Further, due to the increase of the effect of suppression of the temperature rise, it is possible to cool with a small amount of fluid or by blowing fluid for a short amount of time.

According to an 11th aspect of the present invention, there is provided a device testing apparatus comprising a tray for testing while pushing terminals of a plurality of electronic devices carried on the tray against contact portions of a test head; a pusher for pushing each of the plurality of electronic devices held on the tray in the direction of the contact portions; and a heat absorbing and radiating member provided at the pusher.

The heat absorbing and radiating member may be provided separate from at least part of the pusher.

Preferably, the pusher comprises a pusher base provided to be able to move to approach or move away from the contact portion and a pusher block provided integrally with or separate from the pusher base, contacting the electronic device from the reverse surface of the contact portion, and pushing the same.

Preferably, the pusher block is configured as separate from the pusher base and further comprises an elastic member for imparting elasticity to the pusher block in the direction of pushing the electronic device.

Preferably a heat absorbing and radiating member is provided between elastic members. More preferably, heat absorbing and radiating members are provided at the two sides of an elastic member.

More preferably, a flow of gas in the chamber for maintaining an electronic device at a predetermined temperature is blown against the heat absorbing and radiating member. Still more preferably, the pusher is formed with a passage for guiding the flow of gas in the chamber for maintaining the electronic device at a predetermined temperature in the direction of the heat absorbing and radiating member.

Further, the pusher may be formed with a nozzle for guiding temperature control gas, separate from the gas flow in the chamber for maintaining the electronic device at a predetermined temperature, in the direction of the heat absorbing and radiating member.

In the device testing apparatus according to the 11th aspect of the present invention, since a heat absorbing and radiating member (type of cooling unit) is provided at the pusher block (part of pusher), the heat generated by the electronic device is absorbed by the heat absorbing and radiating member and escapes to the surrounding environment from there. As a result, it is possible to prevent destruction or damage of the electronic devices due to overheating, considered a particular problem in high temperature tests etc.

Further, not limited to high temperature tests, the rise in temperature due to the heat generated by the devices is suppressed by the heat absorbing and radiating effect of the heat absorbing and radiating member, so it is possible to conduct tests by the desired accurate temperature and the reliability of the test results is improved.

The heat absorbing and radiating member is not particularly limited, but is configured by a metal etc. superior in heat conductivity. A heat sink formed by heat-radiating fins etc. is preferably used.

In the device testing apparatus according to the 11th aspect of the present invention, the mode of transport of the electronic device to the contact portions is of the type of pushing the electronic device to the contact portion in the state carried on a tray. In particular, in this type, a large number of electronic devices are simultaneously pushed for simultaneous measurement of a large number of electronic devices. Therefore, the area around each electronic device becomes overly crowded and heat easily accumulates. Accordingly, the 11th aspect of the present invention is more preferably applied to a device testing apparatus of a type pushing electronic devices against contact portions in the state carried on a tray.

In the device testing apparatus according to the 11th aspect of the present invention, when pushing the terminals of an electronic device against the contact portion of the test head, the pusher base is made to approach the contact portion and the electronic device is pushed to the contact portion side by the pusher block.

At this time, the positional relationship of the pusher base and the contact portion is restricted to standard dimensions by a stopper or other mechanical mechanism or electrical motor or other electrical mechanism. When error occurs in the positional relationship between the pusher base and the contact portion, the error is absorbed by the pusher block imparting elasticity to the electronic device by an elastic member. Therefore, it is possible to prevent an excessive pushing force from acting on the electronic device and conversely the pushing force becoming insufficient. That is, in the device testing apparatus according to the 11th aspect of the present invention, the stroke of the pusher is not managed. The pushing force against the electronic device is made uniform by controlling the load by the pusher block.

The elastic member is not particularly limited. A coil spring or other various types of elastic members or actuators etc. may be used. Further, the elastic member may be provided at other locations in addition to the pusher base.

The main error occurring in the positional relationship between the pusher base and the contact portion may be considered to be the thickness $\Delta X$ of the electronic device itself, the manufacturing dimensions $\Delta Y$ between the pusher side stopper and pusher surface, and the manufacturing dimensions $\Delta Z$ between the contact portion side stopper and tips of the contact pins. The cumulative amount of the $\Delta X$ to $\Delta Z$ normally rises to as much as ±0.1 to ±0.2 mm or so. When considering the case of use of for example coil springs as the elastic members, however, the error of the pushing force acting on the electronic device becomes ±3 gf/ball or so with respect to a standard load of 25 gf/ball even when error of ±2 mm occurs. There is therefore no problem of an excessive load or insufficient load.

The elastic member is not particularly limited, but more preferably it is made variable in elasticity.

Variability of the elasticity means the elasticity in the direction of pushing the electronic devices given to the pusher block can be changed. The specific means is not particularly limited. For example, it is possible to make the elasticity variable by switching among a plurality of types of elastic members having different coefficients of elasticity or possible to make the elasticity variable by using the same elastic members and changing the basic length of the elastic members.

By making the elasticity of the elastic members variable, it is possible to flexibly deal with any fluctuations in the standard load (pushing force) caused by the test conditions of the electronic devices. Therefore, the range of application of the device testing apparatus becomes greater.

According to the 11th aspect of the present invention, the apparatus can be made smaller in size by efficiently arranging the elastic members and the heat absorbing and radiating member between the pusher based and the pusher block.

Further, according to the 11th aspect of the present invention, by blowing a gas flow in the chamber to a plurality of electronic devices, the gas flow is supplied evenly on the electronic devices, the variation in the temperature distribution due to the heat generated by the electronic devices etc. can be effectively suppressed, and the time for elevation or reduction of the temperature can be shortened.

Further, by forming a passage for guiding the gas flow in the direction of the heat absorbing and radiating member in the pusher base/or pusher block, the gas flow is evenly supplied to the electronic devices, variation in the temperature distribution due to the heat generated by the electronic devices can be effectively suppressed, and the time for elevation or reduction of the temperature can be shortened.

Further, by providing the pusher base and/or pusher block with a nozzle for guiding a temperature control gas, separate from the gas flow in the chamber for maintaining the electronic devices at a predetermined temperature, toward the direction of the heat absorbing and radiating member, fluctuations in the temperature distribution due to the heat generated by the electronic device can be effectively suppressed and the time for elevation or reduction of the temperature can be shortened.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The type of the device testing apparatuses according to the first to 11th aspects of the invention is not particularly limited. The invention may be applied to ones which hold, pick up, or simply push electronic devices, device testing apparatuses of a type holding and testing a plurality of electronic devices, device testing apparatuses of a type testing a plurality of electronic devices loaded on a test tray, etc.

BRIEF DESCRIPTION OF THE DRAWINGS

These and other objects and features of the present invention will become more apparent from the following description of the preferred embodiments given with reference to the attached drawings, in which:

FIG. 16 is a disassembled perspective view of the structure of a bush, insert (test tray), socket guide, and contact pins (contact portion) in the test head shown in FIG. 13;

DESCRIPTION OF THE PREFERRED EMBODIMENTS

First Embodiment

Figure 1:
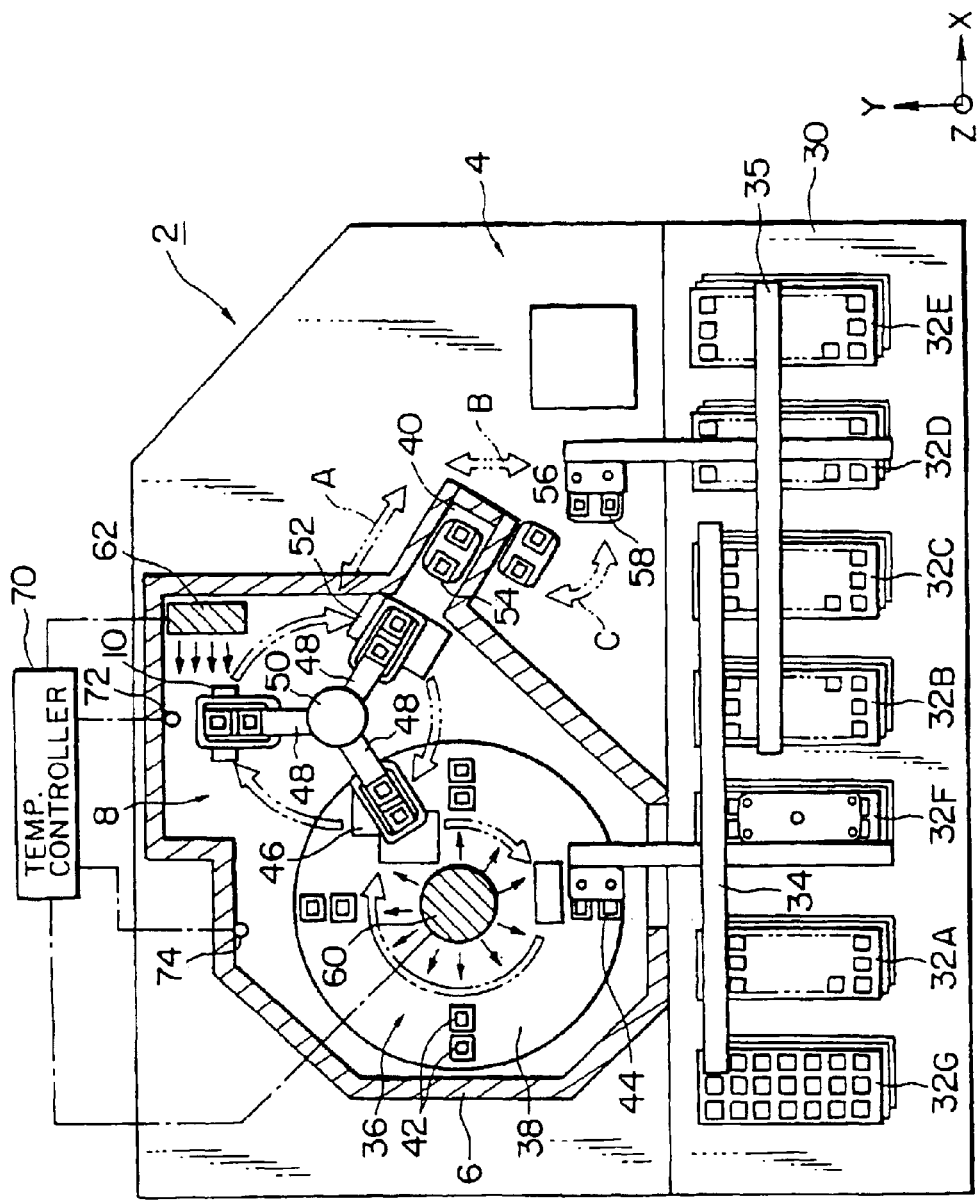
FIG. 1 is a schematic overall view of an IC chip testing apparatus according to a first embodiment of the present invention.

As shown in FIG. 1, the IC chip testing apparatus 2 according to the present embodiment is an apparatus for testing an IC chip, as a device under test, in an ordinary temperature, low temperature, or high temperature state and is provided with a handler 4 and a main test unit, not shown. The handler 4 conveys IC chips under test successively to IC sockets provided at the test head and stores the IC chips finished being tested on predetermined trays sorted in accordance with the test results.

Figure 2:
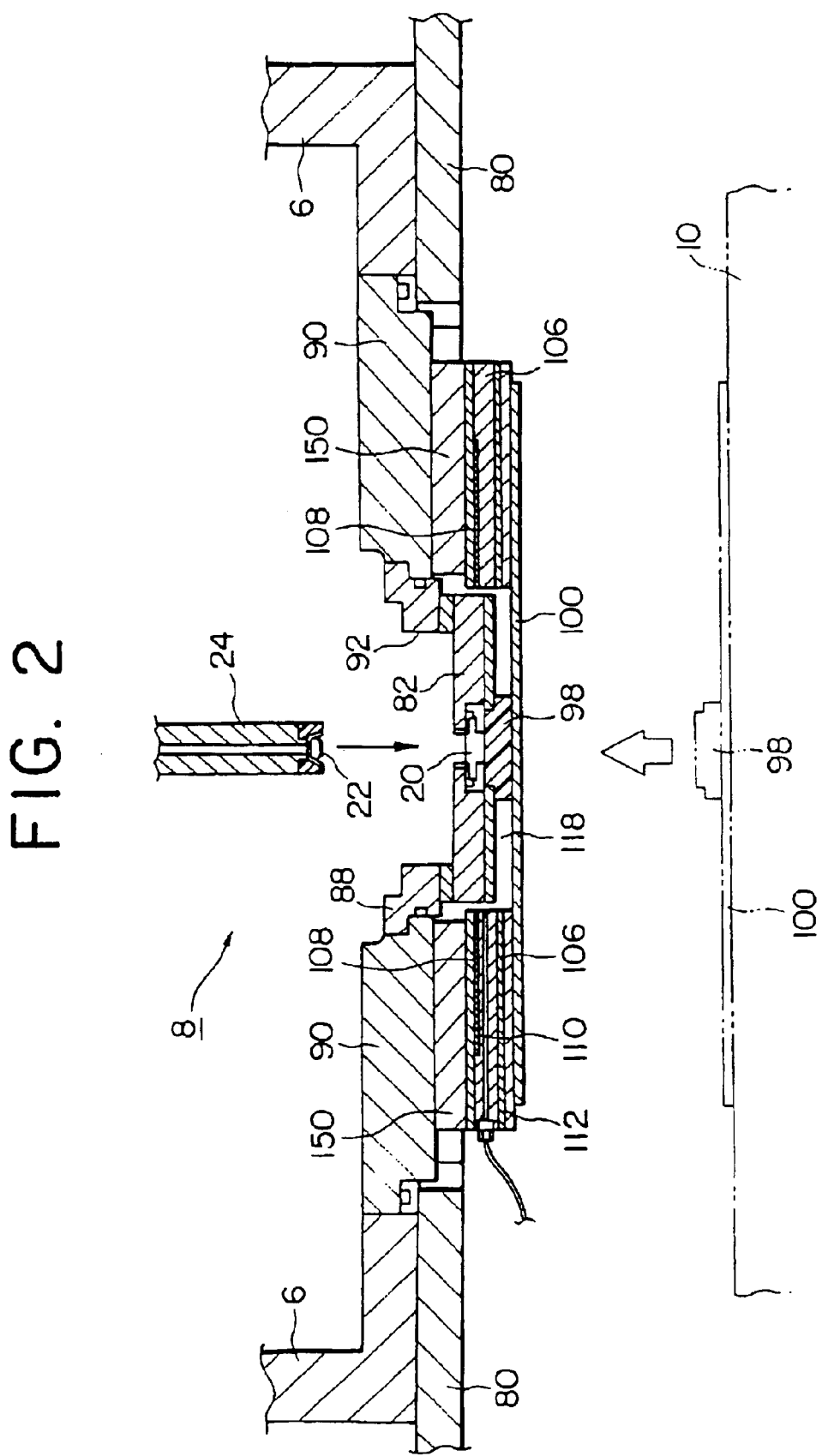
FIG. 2 is a sectional view of key portions of the IC chip testing apparatus.

In this embodiment, the handler 4 is provided with a chamber 6. The top of a test head 10 is exposed at a test stage 8 in the chamber 6. The top of the test head 10 is shown in FIG. 2. The top of the test head 10 has a socket 20 attached to it. The chip mounting opening of the socket 20 faces the inside of the chamber so that the IC chips 22 under test conveyed from a suction head 24 may be successively detachably mounted in it.

The IC sockets 20 provided on the test head 10 are connected through cables to the main test unit (not shown). IC chips 22 detachably mounted at the IC sockets 20 are connected through the cables to the main test unit, then the IC chips 22 are tested by test signals from the main test unit. Details of the IC sockets 20 will be given later.

As shown in FIG. 1, the handler 4 has an IC magazine 30 for storing IC chips to be test and storing tested IC chips sorted into classes. The IC magazine 30 holds loader use trays 32A on which IC chips to be tested are carried, sorting trays 32B to 32E on which tested IC chips are carried sorted into classes, empty trays 32F, and option trays 32G. These trays 32A to 32G are arranged at predetermined intervals along the X-direction and are stacked in the Z-direction (height direction).

IC chips carried on a loader tray 32A are conveyed to a soak stage 36 inside the chamber 6 using the first XY-conveyor 34 attached to the handler 4. Further, the IC chips finished being tested at the test head 10 are loaded and sorted on the sorting trays 32B to 32E of the IC magazine 30 using the second XY-conveyor 35. Among the sorting trays 32B to 32E, for example, the trays 32C are the tray for good devices, while the other trays are the trays for the defective devices or devices for retesting.

The empty trays 32F are conveyed to and stacked over the sorting trays 32B to 32E which have become filled with the tested IC chips and are used as sorting trays. The option trays 32G are used for other applications.

The inside of the chamber 6 is air-tight in structure except for the portion for transfer of the IC chips which is designed to be able to open and close by a shutter etc. and for example can maintain a high temperature state of room temperature to about 160° C. or a low temperature state of room temperature to about −60° C. The inside of the chamber 6 is divided into a soak stage 36, a test stage 8, and an exit stage 40.

The soak stage 36 has a turntable 38 arranged in it. The surface of the turntable 38 has indentations 42 for temporarily holding IC chips arranged at a predetermined pitch along the circumferential direction. In the present embodiment, there are two rows of indentations 42 formed in the radial direction of the turntable 38. The two rows of indentations 42 are arranged at a predetermined pitch in the circumferencial direction. The turntable 38 turns clockwise. The IC chips carried into the indentations 42 of the turntable 38 at the loading position 44 by the first XY-conveyor 34 are given a thermal stress (low temperature or high temperature) until the temperature conditions to be tested are reached while the turntable 38 is being indexed in the direction of rotation.

At a takeout position 46 about 240 degrees in the direction of rotation from the loading position 44 based on the center of rotation of the turntable 38, the suction heads attached to one of the three contact arms 48 are positioned above the turntable 38. At that position, IC chips can be taken out from the indentations 42 by the suction heads. The three contact arms 48 are attached at angles of substantially equal amounts in the circumferential direction with respect to the shaft 50 and can be indexed 120 degrees at a time in the clockwise direction of rotation about the shaft 50. Note that this "index" means to repeatedly turn by a predetermined angle, then stop, then again turn by a predetermined angle. At the time of this indexing of a contact arm 48, the time when the arm 48 is stopped corresponds to the time during which IC chips are mounted in sockets of the test head 10 and tested plus the time for detachment of the IC chips from the sockets. The stopping time of this indexing is the same as the stopping time of the indexing at the turntable 38. The turntable 38 and the contact arms 48 are rotated to be indexed synchronously.

In the embodiment, the suction heads of one of the three contact arms 48 are positioned above the takeout position 46 of the soak stage 36, the suction heads of another of the contact arms 48 are positioned above the contact heads 10 of the test stage 8, and the suction heads of the other of the contact arms 48 are positioned above the inlet 52 of the exit stage 40.

The IC chips loaded in the indentations 42 of the turntable 38 at the loading position 44 of the turntable 38 are given a predetermined thermal stress while being indexed from the loading position 44 to the takeout position 46 and are picked up by the suction heads of a contact arm 48 at the takeout position 46. The IC chips picked up by the suction heads are positioned above the test head 10 by the indexing of the contact arm 48 in the clockwise direction. At that position, as shown in FIG. 2, the IC chips 22 picked up and held by the suction heads 24 are attached to the sockets 20 and tested.

The IC chips 22 attached to the sockets 20 above the test head 10 and finished being tested are picked up again by the suction heads 24 and positioned above the inlet 52 of the exit stage 40 by the indexing of the contact arm 48 shown in FIG. 1 in the clockwise direction. At this position, the tested IC chips are slid to the exit position 54 by an exit shifter in the direction of the arrow A. At the exit position of the exit stage 40, the IC chips arranged above the exit shifter are returned from the temperature of the test, that is, the low temperature or the high temperature, to ordinary temperature. In the case of a low temperature test, the IC chips are returned to ordinary temperature at the exit stage 40 so it is possible to effectively prevent condensation from occurring on the IC chips directly after being taken out from the chamber 6.

The IC chips arranged above the exit shifter at the exit position 54 of the exit stage 40 are returned to ordinary temperature, then shifted in the direction of the arrow B by a not shown exit arm and moved to an exit turn arranged at the receiving position 56. The exit turn is designed to be able to move back and forth between the receiving position 56 and the eject position 58 by turning in the direction of the arrow C. The suction heads of the second XY-conveyor 35 are designed to be able to move to the eject position 58 of the exit turn. The tested IC chips arranged at the eject position by the exit turn are conveyed by the conveyor 35 to one of the sorting trays 32B to 32E based on the test results.

In the device testing apparatus 2 according to the present embodiment, a soak stage heat exchanger 60 is arranged at the ceiling of the soak stage 36 inside the chamber 6 of the handler 4 and a test stage heat exchanger 62 is arranged at the side wall of the test stage 8. These heat exchangers 60 and 62 are provided with cooling units using liquid nitrogen etc. as a coolant and blowers for circulating the cooling air inside the chamber when the tester 2 is able to perform low temperature tests. When the tester is able to perform high temperature tests, the heat exchangers 60 and 62 are provided with heating units and blowers. When the tester is able to perform low temperature tests and high temperature tests, the heat exchangers 60 and 62 are provided with cooling units, heating units, and blowers and are used switching between the cooling units and heating units. These heat exchangers 60 and 62 are controlled by a temperature controller 70. The temperature controller 70 receives as input output signals from a temperature sensor 72 arranged at the test stage 8, temperature sensor 74 arranged at the soak stage 36, and other sensors and can control the amount of heat exchange (output) of the heat exchangers 60 and 62 in accordance with the output signals from these sensors.

In the following explanation, the explanation will be given of the case where the tester 2 is one able to perform both high temperature tests and low temperature tests and the apparatus is used mostly for performing low temperature tests.

As shown in FIG. 2, at the test stage 8, the bottom of the chamber 6 comprised of a heat insulating material etc. and part of the main base 80 holding the chamber 6 are cut away. A socket 20 held on a test head 10 is attached there.

The socket 20 is held in a socket guide 82. The socket guide 82 is attached to a base ring 88. The base ring 88 is attached to a mounting base 90 and constitutes the chamber opening 92. The mounting base 90 has a heat insulating property similar to that of the chamber 6 and is detachably secured to the bottom opening of the chamber 6 and the main base 80.

The back surface of the socket 20 (outside of chamber) has a low temperature socket adapter 98 connected to it. The terminals of the socket 20 are electrically connected with. The adapter 98 is secured at the surface of the approximate center portion of the printed circuit board 100 and enables the electrical connection between the terminals of the socket 20 and the printed circuit board 100. The test head 10 is attached to the bottom surface of the printed circuit board 100. Note that the printed circuit board 100 is also called a performance board.

The test head 10 receives a drive signal from the main test unit, not shown, and sends a test drive signal to an IC chip 22 attached to the socket 20 through the printed circuit board 100 and the adapter 98.

In the present embodiment, as shown in FIG. 2, a heating board 106 having an opening at its center is bolted etc. to the back surface of the mounting base 90 (outside of chamber) through a mounting board serving as both a heat insulating material and seal member. The heating board 106 is also called an HIFIX heater and comprised of a rubber heater or other planar heating element 108 sandwiched between aluminum sheets etc. At the bottom surface of the heating board 106 is affixed in advance a first seal member 112. The first seal member 112 is configured for example as a silicone sponge rubber sheet or other sheet having elasticity.

In this embodiment, when securing the socket adapter 98 attached to the approximate center of the printed circuit board 100 serving as the test board by connecting it to the socket 20, the outer circumferential surface of the printed circuit board 100 directly contacts the bottom surface of the heating board 106 through the first seal member 112 and the printed circuit board 100a is directly heated by the heating board 106.

The heating board 106 has radial drying passages 110 formed in it. Dry gas can be sealed in the first air-tight space 118 formed between the socket guide 82 and the printed circuit board 100. As the dry gas for sealing inside the first air-tight space 118, for example use is made of dry air having for a condensation temperature lower than the inside temperature of the chamber 6. For example, when the inside of the chamber 6 is about −55° C., the condensation temperature of the dry air sealed inside the first air-tight space 118a through the drying passages 110 is preferably about −60° C. The temperature of the dry air is for example room temperature.

Figure 3:
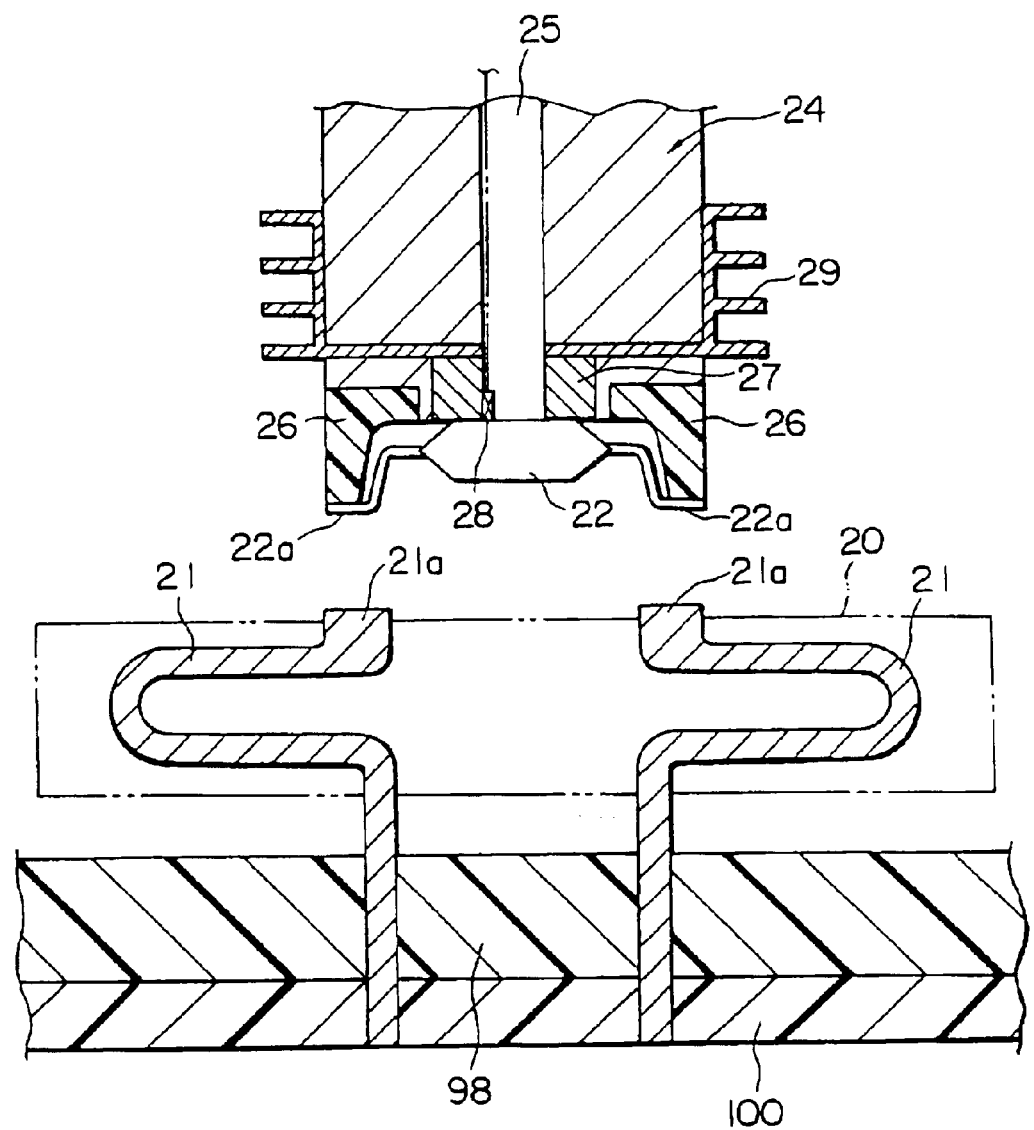
FIG. 3 is a sectional view of key portions showing the vicinity of connection terminals of an IC chip testing apparatus.

As shown in FIG. 3, in the present embodiment, the socket 20 has attached to it connection terminals 21 able to deform elastically in the vertical direction. The bottom ends of the connection terminals 21 are connected to the printed circuit board 100. The top ends of the connection terminals 21 are formed with contacts 21a against which the terminals 22a of the IC chip 22 are pushed and electrically connected.

In the present embodiment, the suction head 24 also functions as a pusher. When testing an IC chip 22, the IC chip 22 picked up by the vacuum suction bore 25 is pushed in the direction of the connection terminals 21 to secure electrical connection between the terminals 22a and the contacts 21a of the connection terminals 21.

The bottom end of the suction head 24 has attached to it a pushing pad 26 for contacting the top surface of the terminals 22a of the IC chip 22 and pushing these terminals 22a against the contacts 21a of the connection terminals 21. The pushing pad 26 is comprised of a synthetic resin or other insulating member.

Inside of the suction head 24 positioned around the bottom end of the vacuum suction bore 25 is buried a cooling unit 27 directly contacting the IC chip 22 or indirectly contacting it through an insulating member for cooling the same. The cooling unit 27 is comprised for example of a Peltier element, vortex tube, heat pipe, cooling use heat exchanger, etc. A Peltier element is an element able to cool by electricity. A vortex tube is a cooling unit able to cool by blowing compressed air. A heat pipe is a unit using the movement of fluid in the pipe to absorb heat. As the heat exchanger, a passage for circulating liquid nitrogen or another coolant or a passage for circulating a coolant from a refrigeration cycle may be mentioned. Note that when using as a cooling unit 27 a Peltier element or heat pipe, the position opposite to the cooling side becomes a heat radiating portion, so, as shown in FIG. 3, the cooling fins 29 may be connected to the cooling unit 27. Further, when the suction head 24 itself is superior in heat conductivity, the outer circumferential surface of the suction head is processed to roughen it to make it function as heat radiating fins. Further, the cooling unit 27 may be another cooling unit than the above.

Near the cooling unit 27 is arranged a temperature sensor 28. The temperature of the IC chip 22 cooled by the cooling unit 27 can be directly or indirectly measured. The temperature sensor 28 is not particularly limited, but a platinum sensor or other thermocouple or other temperature sensor can be used. The temperature signal measured by the temperature sensor 28 is input to the controller. This controls the cooling output by the cooling device 27 so as to cancel the heat generated by the IC chip 22 during tests and maintain the IC chip 22 constantly at a predetermined temperature.

In the IC chip testing apparatus 2 according to the present embodiment, even if the IC chip 22 generates heat on its own at the time of testing, the cooling unit 27 cools the IC chip 22, so it is possible to cancel out the effect due to the heat generated by the IC chip 22 and to test the IC chip 22 at a predetermined low temperature as prescribed in the specifications.

In the device testing apparatus of the present embodiment, a heating board 106 is attached around the chamber opening 92a of the chamber 6 with an inside cooled to a temperature below ordinary temperature and the printed circuit board 100*a* is heated by heat conduction. The printed circuit board 100 positioned behind the socket 20 is heated to a temperature above the condensation point of the ambient gas. Therefore, it is possible to effectively prevent condensation from occurring at the printed circuit board 100 behind the socket.

Further, in the IC chip testing apparatus according to the present embodiment, since a special spacing frame or other heat insulating structure is not employed, the manufacturing costs become lower. Further, since the distance between the printed circuit board 100 and the socket 20 is remarkably short, the electrical path from the socket 20 to the printed circuit board 100 (electrical cables etc.) can be shortened, greater resistance to noise can be obtained, and the reliability of the tests can be improved.

Further, in the IC chip testing apparatus 2 according to this embodiment, by bringing the printed circuit board 100 into contact with the heating board 106 so as to form a first air-tight space 118 at the printed circuit board side of the socket guide 82 and forming in the heating board 106 a drying passage 110 for feeding dry gas in the first air-tight space 118, the first air-tight space 118 can be filled with a dry gas. This enables condensation behind the socket guide 82 to be further effectively prevented.

Second Embodiment

Figure 4:
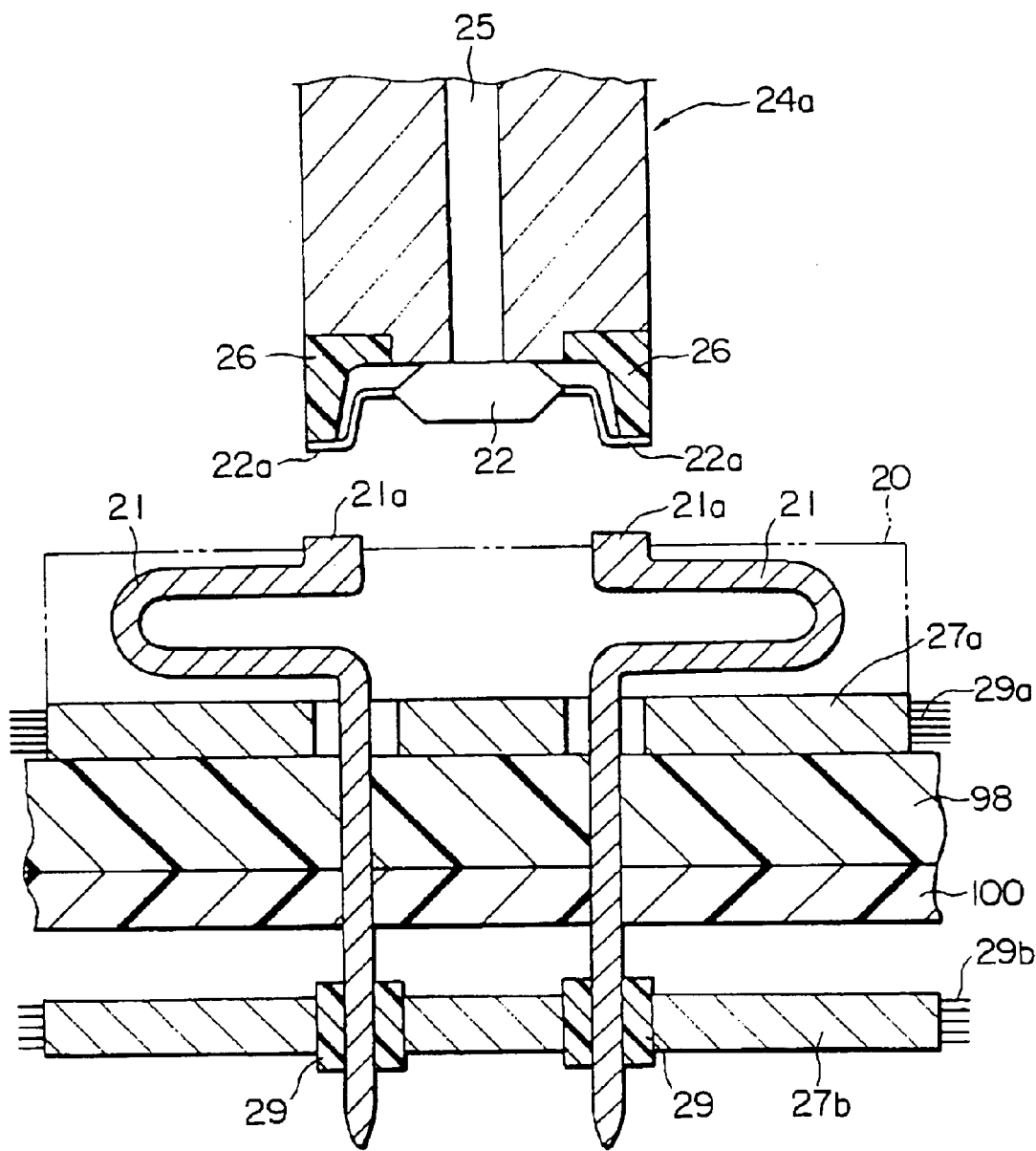
FIG. 4 is a sectional view of key portions showing the vicinity of connection terminals of an IC chip testing apparatus according to another embodiment of the present invention.

As shown in FIG. 4, in the second embodiment of the present invention, no cooling unit is attached at the suction head 24*a* side. A cooling unit 27*a* or 27*b* is attached at the side of the socket 20. The position of arrangement of the cooling unit 27*a* or 27*b* is not particularly limited, but for example as shown in FIG. 4 the unit may be arranged between the socket 20 and socket adapter 98 or at the position of the bottom ends of the connection terminals 21.

When arranging the cooling unit 27*a* between the socket 20 and the socket adapter 28, it is preferable to form a space to prevent short-circuiting with the connection terminals 21. In this case, the cooling unit 27*a* cools the IC chip 22 through the socket 20 to cancel the heat generated by the IC chip 22 and thereby enable the IC chip 22 to be tested at a low temperature as prescribed in the specifications.

When arranging the cooling unit 27*b* at the position of the bottom ends of the connection terminals 21, the cooling unit 27*b* is attached at the bottom ends of the connection terminals 21 through a plastic or other insulating member 29. In this case, the cooling unit 27*b* cools the IC chip 22 through the insulating member 29 and connection terminals 21 to cancel the heat generated by the IC chip 22 and thereby enable the IC chip 22 to be tested at a low temperature as prescribed in the specifications.

The cooling units 27*a* and 27*b* are comprised of cooling units similar to the above cooling unit 27. Note that when the cooling unit 27*a* or 27*b* itself has an insulating property, the cooling unit 27*a* or 27*b* may be brought into direct contact with the connection terminals 21. The cooling unit 27*a* or 27*b* may be provided with heat radiating fins 29*a* or 29*b* if necessary for cooling.

Modifications of First Embodiment and Second Embodiment

In the above first and second embodiments, the explanation was made with reference to an IC chip testing apparatus 2 mainly performing low temperature tests, but it is also possible to use the device 2 of the present embodiments to conduct ordinary temperature tests of electronic devices. In this case, the test chamber 6 and the temperature controller attached inside it may be eliminated. Even without the test chamber 6 and the internal temperature controller, if it were possible to control the IC chip 22 to a predetermined ordinary temperature by just the cooling unit 27, 27*a*, and/or 27*b*, the chamber 6 and internal temperature controller would become unnecessary.

When conducting low temperature tests on an IC chip 22, however, if just maintaining the IC chip 22 at a low temperature state, condensation would sometimes become a problem, so it is preferable to use the test chamber 6 to cover the test stage 8 and maintain the ambient temperature of the inside of the chamber 6 at a predetermined low temperature state.

Further, even when conducting high temperature tests on an IC chip 22, the present invention is effective from the viewpoint of control to prevent the temperature of the IC chip 22 exceeding a predetermined temperature.

Third Embodiment

The overall configuration of the IC chip testing apparatus according to the present invention is similar to that of the device testing apparatus according to the first embodiment shown in FIG. 1. Part of the explanation thereof will therefore be omitted.

Figure 5:
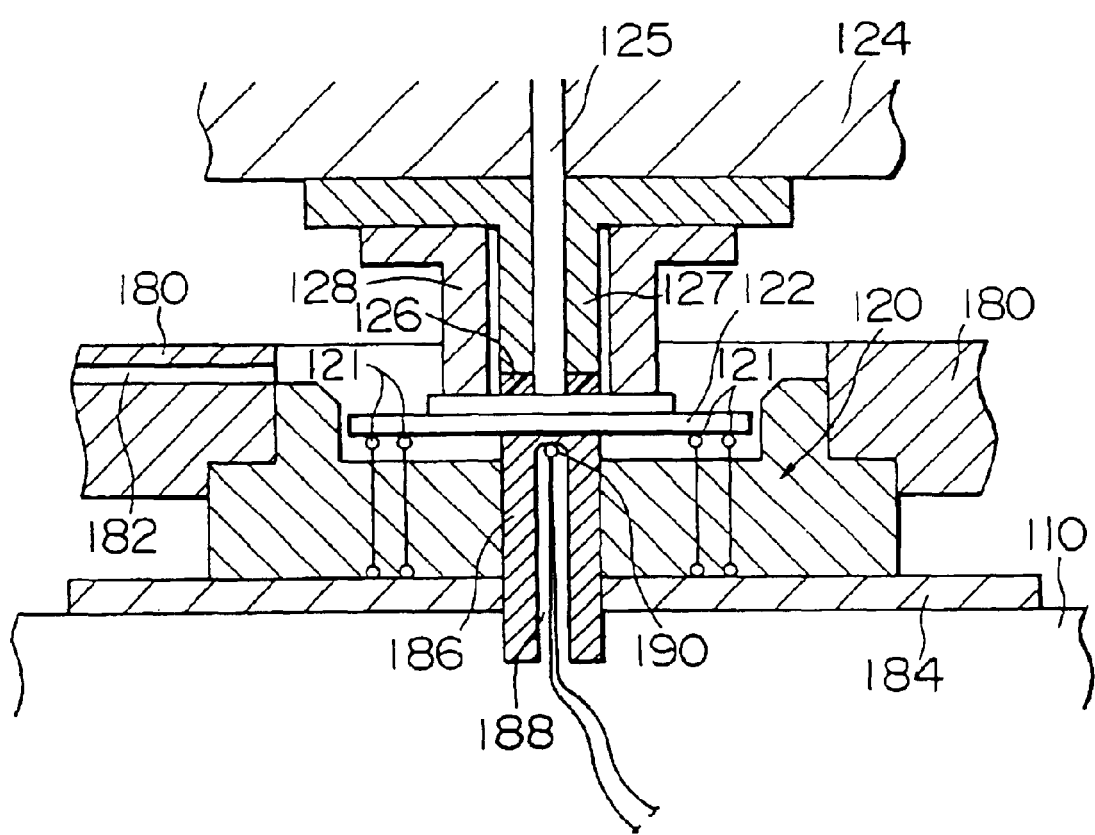
FIG. 5 to FIG. 12 are sectional views of key portions of IC chip testing apparatuses according to other embodiments of the present invention.

As shown in FIG. 5, at the test stage, part of the chamber comprised of the heat insulating material etc. is cut away. A socket 120 held on a test head is attached there.

The socket 120 is held by the socket guide 180. The socket guide 180 is attached to the bottom opening of the chamber 6 shown in FIG. 1 through a not shown base ring etc.

A printed circuit board 184 is arranged behind the socket 120 (outside of chamber). The socket 120 has attached to it connection terminals 121 able to elastically deform in the vertical direction. The bottom ends of the connection terminals 121 are connected to the printed circuit board 184. The top ends of the connection terminals 121 are pushed against by the terminals of the IC chip 122 for electrical connection. At the bottom surface of the printed circuit board 184 is attached a test head 110. Note that the printed circuit board 184 is also called a performance board.

The test head 110 receives a drive signal from the main test unit, not shown, and sends a test drive signal to the IC chip 122 connected to the connection terminals 121 of the socket 120 through the printed circuit board 184.

In the present embodiment, as shown in FIG. 5, a suction nozzle 127 having a vacuum suction bore 125 is provided below each of the suction heads 124. The suction nozzle 127 also serves as a pusher. When testing the IC chip 122, the IC chip 122 picked up by the vacuum suction bore 125 is pushed in the direction of the connection terminals 121 to secure electrical connection between the terminals of the IC chip 122 and the connection terminals 121.

At the bottom end of the suction nozzle 127 is attached a pushing pad 126 for contacting the top surface of the IC chip 122 (first surface) and pushing the terminals of the IC chip 122 against the connection terminals 121 of the socket 120. The pushing pad 126 is comprised of a synthetic resin or other insulating material. Note that an outer cylinder 128 may be provided around the outer circumference of the suction nozzle 127. The outer cylinder 128 is for example comprised of a conductive metal. By its lower end contacting the IC chip 122, it is possible to drain the static electricity of the chip 122. In the present invention, the pusher also includes this outer cylinder 128.

The vacuum suction bore 125 formed in the suction nozzle 127 is given a suitable negative pressure by a not shown ejector or other vacuum generator to detachably pick up and hold the IC chip 122 at the lower end of the suction pad 126. Note that at the time of testing the IC chip 122, negative pressure is not introduced to the vacuum suction bore 125. An IC chip 122 is pushed by the suction pad 126 in the direction of the socket 120 for connection of the terminals of the IC chip 122 and the connection terminals of the socket 120.

As shown in FIG. 5, in the present embodiment, a temperature sensor protecting cylinder 186 is attached through the approximate center of the socket 120 and the printed circuit board 184. Inside the temperature sensor protecting cylinder 186 is formed an axial bore 188 along the axial direction. Behind the wall at the top part of the axial bore 188 is attached a temperature sensor 190. In the present embodiment, the temperature sensor 190 is comprised by a thermocouple, platinum temperature measuring resistor, thermistor, or other contact-type temperature sensor. The temperature sensor 190 enables direct measurement of the temperature of the IC chip 122 by the top surface of the wall of the top part of the sensor protecting cylinder 186 being brought in close contact with the back (second surface) of the IC chip 122.

The temperature data of the IC chip 122 detected by the temperature sensor 190 is sent to a not shown controller. The controller detects when the IC chip 122 has become higher than the set temperature due to heat it generates during testing and blows a cooling medium through the cooling medium passage 182 (cooling medium blowing means) formed at the socket guide 180 or another member to around the IC chip 122 to cool the IC chip 122.

The cooling medium is not particularly limited, but dry air having a condensation point about the same or lower than the inside temperature of the chamber 6 is preferable. For example, when the inside of the chamber 6 is about –55° C., the condensation temperature of the dry air passing through the cooling medium passage 182 and blown around the IC chip 122 is preferably a temperature of –55° C. or lower. The temperature of the cooling medium itself blown through the cooling medium passage 182 toward the IC chip 122 is controlled to about the same degree as the air temperature inside the chamber 6. The temperature of the cooling medium, amount blown, and blowing time are determined so that the temperature of the IC chip 122 detected by the temperature sensor 190 becomes a temperature inside the permissible range of the test specifications. That is, the controller monitors the temperature output of the temperature sensor 190 and controls the temperature, amount, and blowing time of the cooling medium blown from the cooling medium passage 182 to around the IC chip 122 so as to cancel out the heat generated by the IC chip 122 during testing and thereby control the temperature so that the IC chip 122 is constantly maintained at a set temperature.

Note that the cooling medium passage 182 is comprised by forming a through hole in an existing socket adapter 180, but it is also possible to form a cooling medium passage in another member separate from the socket adapter 180. It is also possible to attach a tube, nozzle, etc. to blow the cooling medium around the IC chip 122. Further, the cooling medium passage 182 may be a single passage. When a plurality are provided, however, the cooling efficiency is further improved. Further, it is possible to provide around the IC chip 122, along with a cooling medium blowing means comprised of such a cooling medium passage 182 etc., an ambient gas suction means for sucking in the gas around the IC chip 122. By sucking in the gas present around the IC chip 122 (gas becoming higher in temperature than the set temperature due to the heat generated by the IC chip 122.) and cooling the area around the IC chip 122 by the cooling medium blowing means, the cooling efficiency is further improved.

In such an IC chip testing apparatus according to the present embodiment, even if the IC chip 122 generates heat on its own at the time of testing, the heat generated is detected by the temperature sensor 190 and a cooling medium controlled in its temperature, amount, etc. so as to cancel out the effects of the heat generated by the IC chip 122 is blown from the cooling medium passage 182 toward the IC chip 122 for a predetermined time. Therefore, at the time of testing, it is possible to test an IC chip 122 at a predetermined set temperature as prescribed in the specifications at all times.

In particular, with an IC chip testing apparatus according to the present embodiment, since a temperature sensor 190 detecting the temperature of the IC chip 122 is arranged at the socket 120 side, the electrical wiring from the temperature sensor 120 becomes simple even in a tester having a rotary arm type suction head. Note that in the past, a temperature sensor was arranged at the suction nozzle 127 side and the suction nozzle 127 was made to rotate by the rotary arm 48 shown in FIG. 1, so it was necessary to provide a rotary contact connection terminal etc. in the middle of the electrical wiring from the temperature sensor and the wiring became more complicated.

Further, in a testing apparatus having a rotary arm type suction head 124, a plurality of rotary arms 48 are generally arranged around the shaft 50 shown in FIG. 1. When attaching a temperature sensor to a suction nozzle 127 of a suction head 124 or the outer cylinder 127, a number of temperature sensors corresponding to the number of suction nozzles 1276 or outer cylinders 128 becomes necessary. As opposed to this, in the tester according to the present embodiment, it is sufficient to provide a number of temperature sensor 190 corresponding to the number of sockets 120 in which IC chips 122 are mounted, so it is possible to reduce the number of the temperature sensors 190.

Fourth Embodiment

Figure 6:
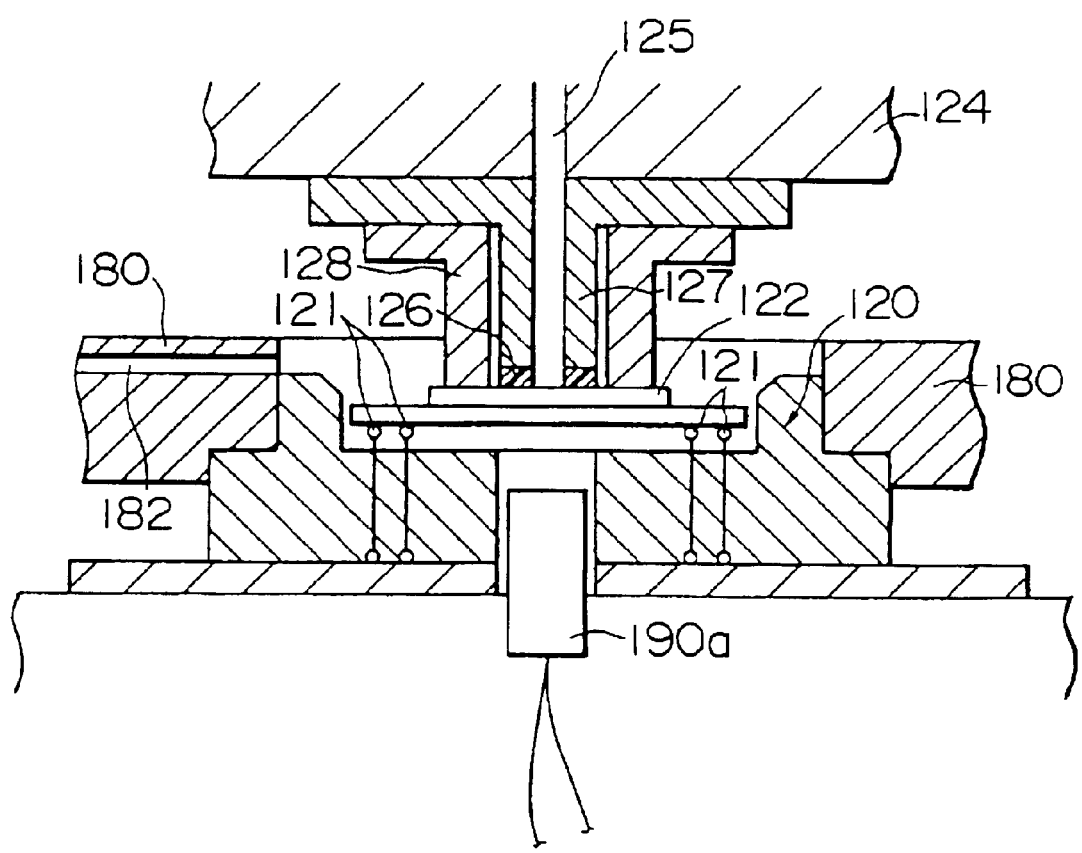

As shown in FIG. 6, in this embodiment, instead of the contact type temperature sensor 190 shown in FIG. 5, a non-contact type temperature sensor 190a such as a radiation thermometer using infrared rays etc. is arranged. The rest of the structure is similar to that of the tester according to the embodiment shown in FIG. 5. Common members are assigned common reference numerals and common portions of the explanations are omitted.

As shown in FIG. 6, the testing apparatus according to this embodiment is exactly the same as the tester of the embodiment shown in FIG. 5 except for having the non-contact type temperature sensor 190a and exhibits similar actions and effects.

Fifth Embodiment

Figure 7:
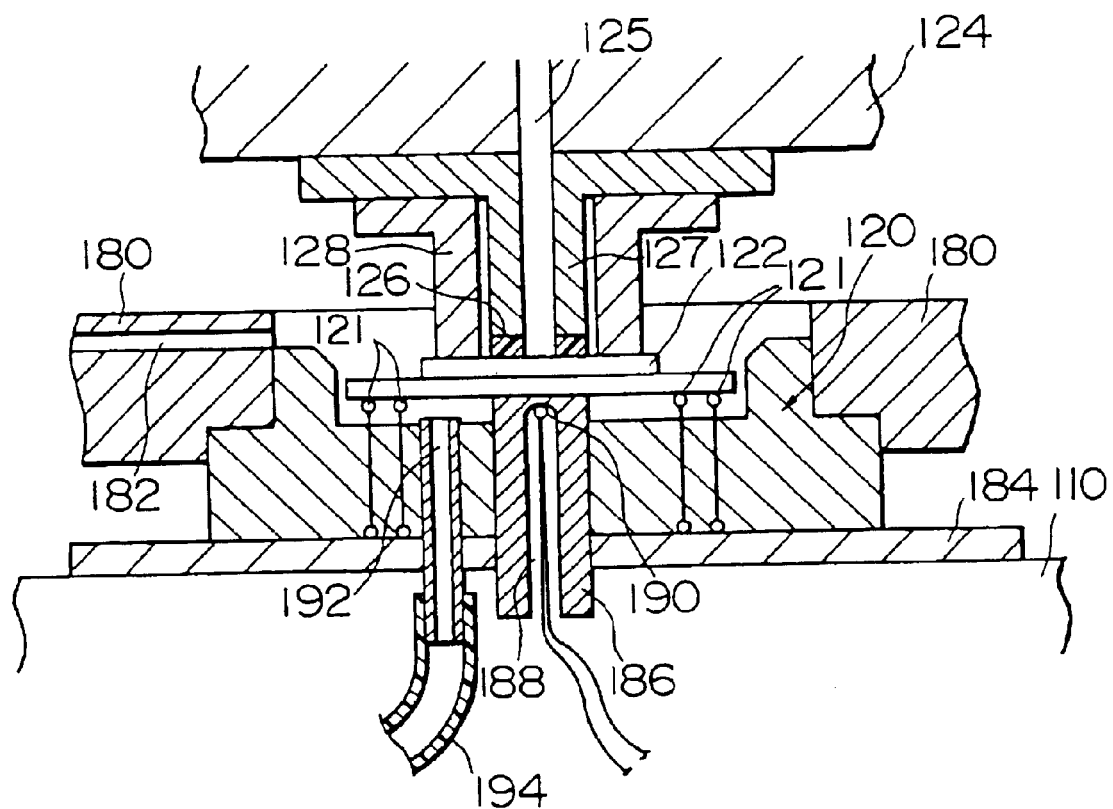

As shown in FIG. 7, in this embodiment, instead of the cooling medium passage 182 formed at the socket adapter 180 shown in FIG. 5 or along with the same, a cooling medium blowing nozzle 192 (cooling medium blowing means) for blowing a cooling medium toward the back (second surface) of the IC chip 122 is attached to the back of the socket 120. The cooling medium blowing nozzle 192 has a tube 194 connected to it. A cooling medium is fed from a not shown cooling medium generating means. The cooling medium can be blown from the nozzle 192 to the back of the IC chip 122.

The cooling medium generating means is not particularly limited, but for example in the case of a low temperature test, it may be comprised of a heat exchanger using liquid nitrogen for lowering the temperature of the inside of the chamber 6 and a blower while in the case of a high temperature test it may be comprised of a heat exchanger using a heater or a cooling element and a blower.

The rest of the structure is similar to that of the tester according to the embodiment shown in FIG. 5. Common members are assigned common reference numerals and common portions of the explanations are omitted.

As shown in FIG. 7, the tester according to this embodiment is exactly the same as the testing apparatus of the embodiment shown in FIG. 5 except for having the blowing nozzle 192 for blowing a cooling medium to the back of the IC chip 122, so exhibits similar actions and effects as the third embodiment and improves the cooling efficiency of the IC chip 122.

Sixth Embodiment

Figure 8:
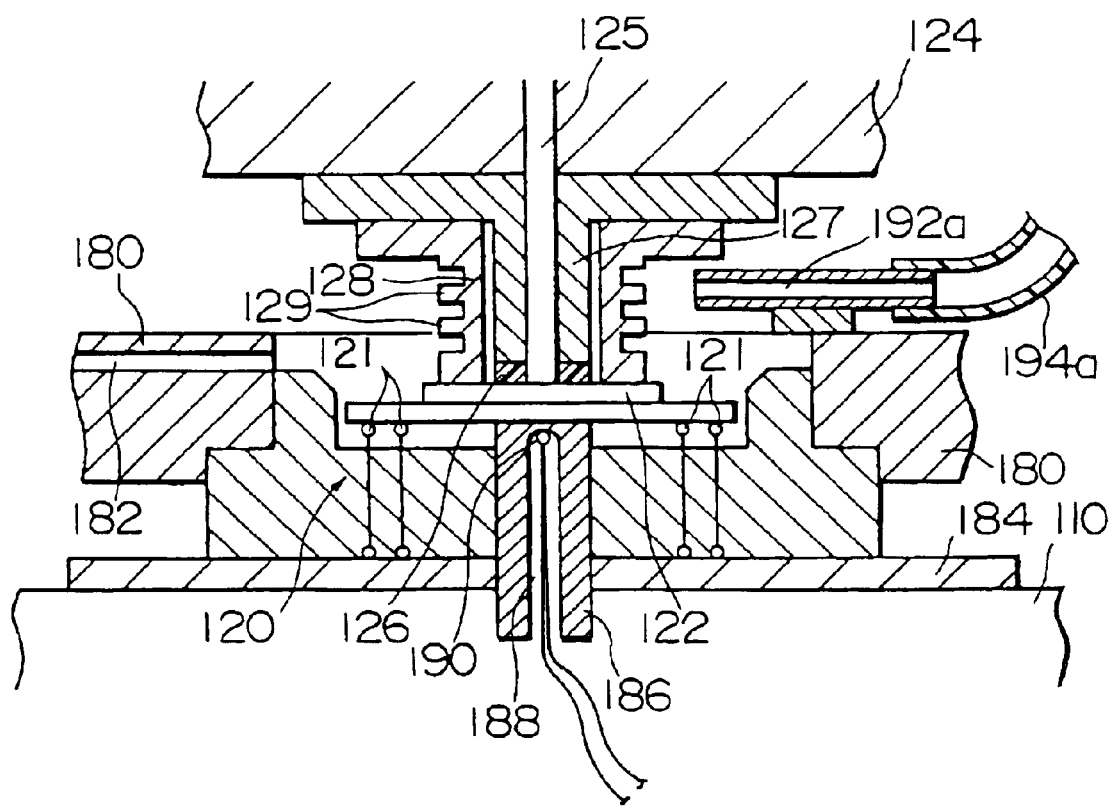

As shown in FIG. 8, in this embodiment, instead of the cooling medium passage 182 formed at the socket adapter 180 shown in FIG. 5 or along with the same, a cooling medium blowing nozzle 192*a* (cooling medium blowing means) for blowing a cooling medium toward the side surfaces of the suction nozzle 127 and the outer cylinder 128 is arranged. The cooling medium blowing nozzle 192*a* in this embodiment is secured on the socket adapter 180.

The cooling medium blowing nozzle 192*a* has a tube 194*a* connected to it. A cooling medium is fed from a not shown cooling medium generating means. The cooling medium generating means used is one similar to that illustrated in the third embodiment.

At the outer circumference of the outer cylinder 128 and/or suction nozzle 127 to which the cooling medium from the cooling medium blowing nozzle 192*a* is blown is preferably formed heat exchange fins 129 for raising the heat exchange efficiency and more quickly cooling the outer cylinder 128 and/or suction nozzle 127.

The rest of the structure is similar to that of the tester according to the embodiment shown in FIG. 5. Common members are assigned common reference numerals and common portions of the explanations are omitted.

As shown in FIG. 8, the tester according to this embodiment is exactly the same as the tester of the embodiment shown in FIG. 5 except for the formation of heat exchange fins 129 at the outer circumference of the outer cylinder 128 and blowing a cooling medium to the side surface of the outer circumference of the outer cylinder 128, so exhibits similar actions and effects as the third embodiment and exhibits the actions and effects explained below.

That is, a variety of components are arranged around the socket 120 used in the testing of an IC chip 122 and it is often difficult to blow a cooling medium directly toward the IC chip 122. In the present embodiment, the cooling medium is blown toward the side surface of the outer cylinder 128 to cool the IC chip 122 indirectly. At this time, by providing heat exchange fins 129 or other projections or depressions at the outer circumference of the outer cylinder 128, it is possible to increase the heat exchange efficiency, cool the outer cylinder 128 efficiently, and efficiently cool the IC chip 122 indirectly. In the present embodiment as well, it is possible to cancel out the effect of the heat generated by the IC chip 122 well and test the IC chip 122 at a predetermined temperature as prescribed in the specifications.

Note that as a modification of this embodiment, it is possible not to provide the cooling medium blowing nozzle 192*a* or cooling medium blowing passage 182 shown in FIG. 8, but to provide heat exchange fins 129 and other projections or depressions at the outer circumference of the suction nozzle 127. When the heat generated by the IC chip 122 is not that large, it is possible to cool the IC chip 122 even with radiation of heat by the projections or depressions.

Seventh Embodiment

Figure 9:
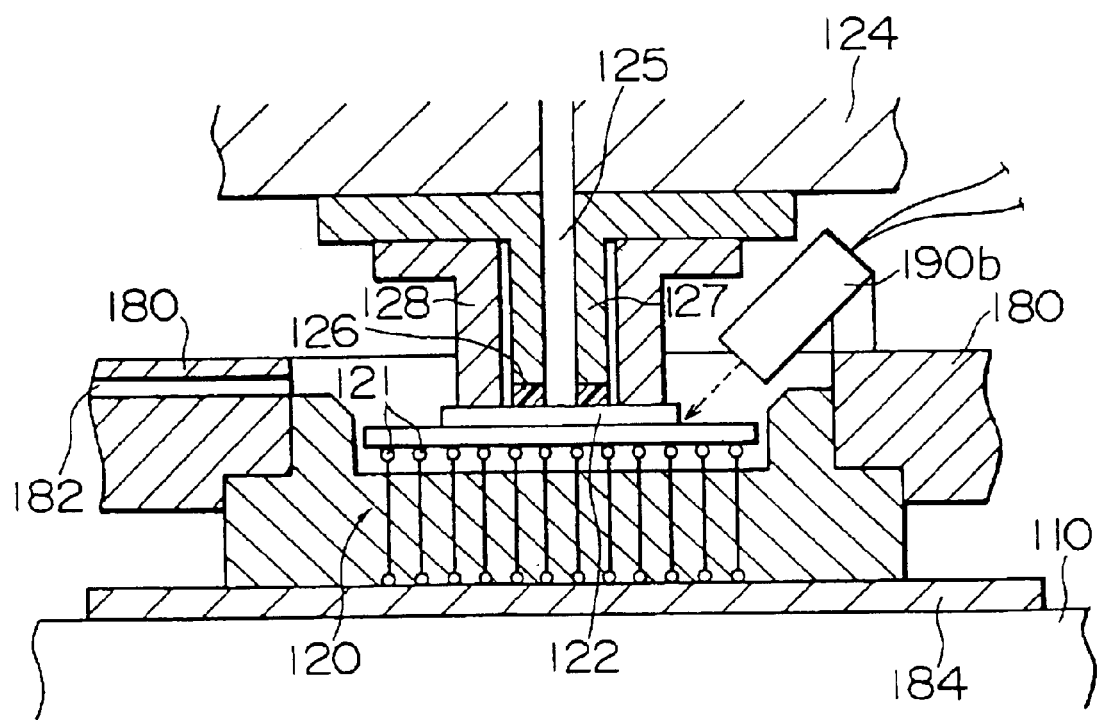

As shown in FIG. 9, in this embodiment, terminals are formed over the entire back of the IC chip 122. Corresponding to this, a large number of connection terminals 121 are arranged at the socket 120. Therefore, in this embodiment, there is no space to provide a temperature sensor 190 or 190*a* at the socket 120 side. Accordingly, in this embodiment, as shown in FIG. 9, a non-contact type temperature sensor 190*b* is arranged at the side (pusher side) of the suction nozzle 127 and outer cylinder 128. This non-contact temperature sensor 190*b* is secured to the socket adapter 180 and not secured to the suction nozzle 127 and outer cylinder 128 and does not move along with them. The direction of measurement of temperature of this non-contact type temperature sensor 190*b* is toward the top surface (first surface) of the IC chip 122. The temperature of the IC chip 122 can be measured without contact.

The rest of the structure is similar to that of the tester according to the embodiment shown in FIG. 5. Common members are assigned common reference numerals and common portions of the explanations are omitted.

As shown in FIG. 9, the tester according to this embodiment exhibits similar actions and effects as the third embodiment and exhibits the actions and effects explained below.

That is, when terminals of an IC chip 122 are arranged over the entire back (second surface) of the IC chip 122, a corresponding number of connection terminals are arranged without intervening space at the socket 120. In such a case, it is difficult to measure the temperature of the IC chip 122 from the socket side. In the present embodiment, the temperature of the surface of the pusher side of the IC chip 122 is measured by the non-contact type temperature sensor 190*b*.

If using a non-contact type temperature sensor 190*b*, there is no need to secure it to the suction nozzle 127 or outer cylinder 128 and there is no need to make it rotate by the rotary arm together with the suction nozzle 127 and outer cylinder 128. Therefore, even in a tester having a rotary arm type suction head 124, the electrical wiring from the temperature sensor 190*b* does not become complicated. In the tester of the present embodiment, a non-contact type temperature sensor 190*b* is used to accurately measure the temperature of the IC chip 122 and a cooling medium is blown on the IC chip 122 based on the measurement results to cool the IC chip 122. Therefore, it is possible to cancel out the effect of heat generated by the IC chip 122 well and test the IC chip 122 at a predetermined temperature as prescribed in the specifications.

Eighth Embodiment

Figure 10:
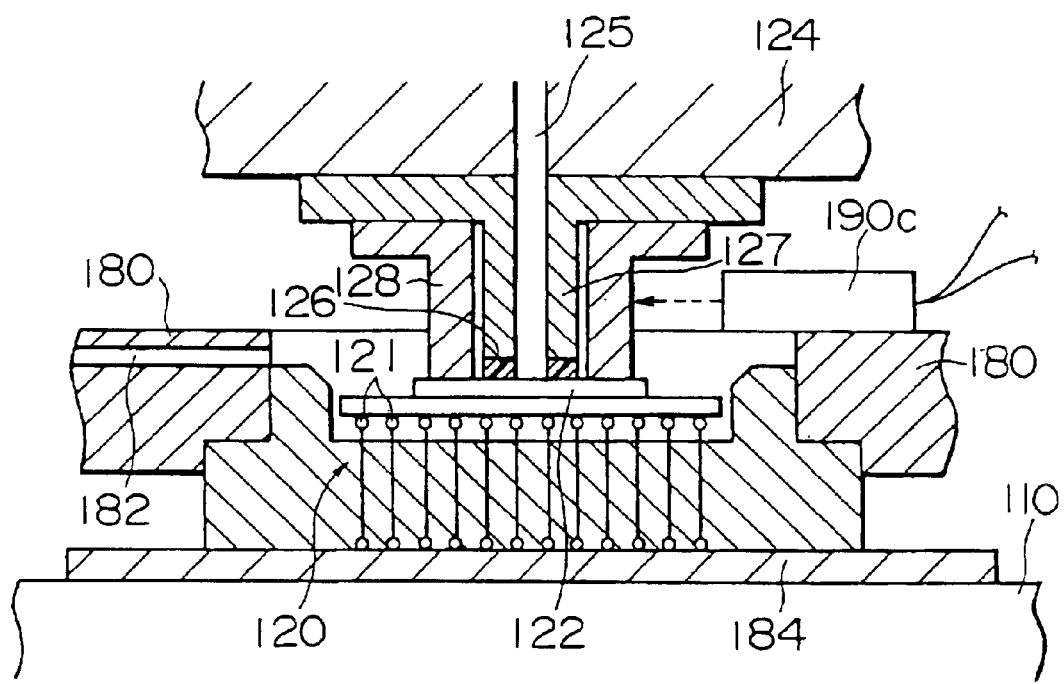

As shown in FIG. 10, in this embodiment, terminals are formed over the entire back of the IC chip 122. Corresponding to this, a large number of connection terminals 121 are arranged at the socket 120. Therefore, in this embodiment, there is no space to provide a temperature sensor 190 or 190*a* at the socket 120 side. Accordingly, in this embodiment, as shown in FIG. 9, a non-contact type temperature sensor 190*c* is arranged at the side (pusher side) of the suction nozzle 127 and outer cylinder 128. This non-contact temperature sensor 190*c* is secured to the socket adapter 180 and not secured to the suction nozzle 127 and outer cylinder 128 and does not move along with them. The direction of measurement of temperature of this non-contact type temperature sensor 190c is toward the outer circumferential surface of the outer cylinder 128 (pusher). The temperature of the outer cylinder 128 can be measured without contact.

The rest of the structure is similar to that of the tester according to the embodiment shown in FIG. 5. Common members are assigned common reference numerals and common portions of the explanations are omitted.

As shown in FIG. 10, the tester according to this embodiment exhibits similar actions and effects as the third embodiment and exhibits the actions and effects explained below.

That is, when terminals of an IC chip 122 are arranged over the entire back (second surface) of the IC chip 122, a corresponding number of connection terminals are arranged without intervening space at the socket 120. Further, the suction nozzle 127 and outer cylinder 128 are arranged above the socket, so even if a non-contact type temperature sensor is used, it is often difficult to directly measure the temperature from the top surface (first surface) of the IC chip 122. Therefore, in the present embodiment, the temperature of the outer cylinder 128 is measured by the non-contact type temperature sensor 190c.

If using a non-contact type temperature sensor 190c, there is no need to secure it to the suction nozzle 127 or outer cylinder 128 and there is no need to make it rotate by the rotary arm together with the suction nozzle 127 and outer cylinder 128. Therefore, even in a tester having a rotary arm type suction head 124, the electrical wiring from the temperature sensor 190c does not become complicated. In the testing apparatus of the present embodiment, rather than directly measure the temperature of the IC chip 122., a non-contact type temperature sensor 190c is used to measure the temperature of the outer cylinder 128 so as to estimate the temperature of the IC chip 122 and thereby detect the temperature rise due to heat generated by the IC chip 122. The IC chip 122 contacts the outer cylinder 128, so if the IC chip 122 rises in temperature due to heat it generates, the temperature of the outer cylinder 128 also rises. The temperature of the outer cylinder 128 and the temperature of the IC chip 122, however, do not always match, so in order to estimate the temperature of the IC chip 122 from the detected temperature of the outer cylinder 128, it is necessary to consider a correction value found by experiments etc. for the detected temperature of the outer cylinder 128 to estimate the temperature of the IC chip 122.

In the present embodiment, a non-contact type temperature sensor 190c is used to measure the temperature of the outer cylinder 128, the temperature of the IC chip 122 is accurately predicted from the detected temperature, and the cooling medium is blown on the IC chip 122 based on the results so as to cool the IC chip 122. Therefore, it is possible to cancel out the effect of heat generated by the IC chip 122 well and test the IC chip 122 at a predetermined temperature as prescribed in the specifications.

Modifications of Third to Eighth Embodiments

In the above embodiments, the explanation was given of the case of an IC chip testing apparatus mainly conducting low temperature tests, but it is also possible to use the tester of the present invention to conduct ordinary temperature tests of electronic devices. In such a case, the test chamber and the temperature controller attached inside it may be eliminated. If it is possible to control the IC chip 122 to the predetermined ordinary temperature by just the cooling medium blowing passage 82, cooling medium blowing nozzle 192 or 192a, or other cooling medium blowing means even without the test chamber and internal temperature controller, the chamber and internal temperature controller become unnecessary.

When conducting low temperature tests on an IC chip 122, however, if just holding the IC chip 122 in a low temperature state, condensation sometimes becomes a problem, so it is desirable to use a test chamber to cover the area around the test stage and keep the ambient temperature inside the chamber at a predetermined low temperature state.

Further, when testing an IC chip 122 at a high temperature, the present invention is effective from the viewpoint of control of the temperature of the IC chip 122 so that it does not exceed a predetermined temperature.

Ninth Embodiment

The overall configuration of the device testing apparatus according to this embodiment is not particularly limited. It may be that of the device testing apparatus 2 shown in FIG. 1 or may be that of the device testing apparatus 1001 shown in the later explained FIG. 13.

Figure 11:
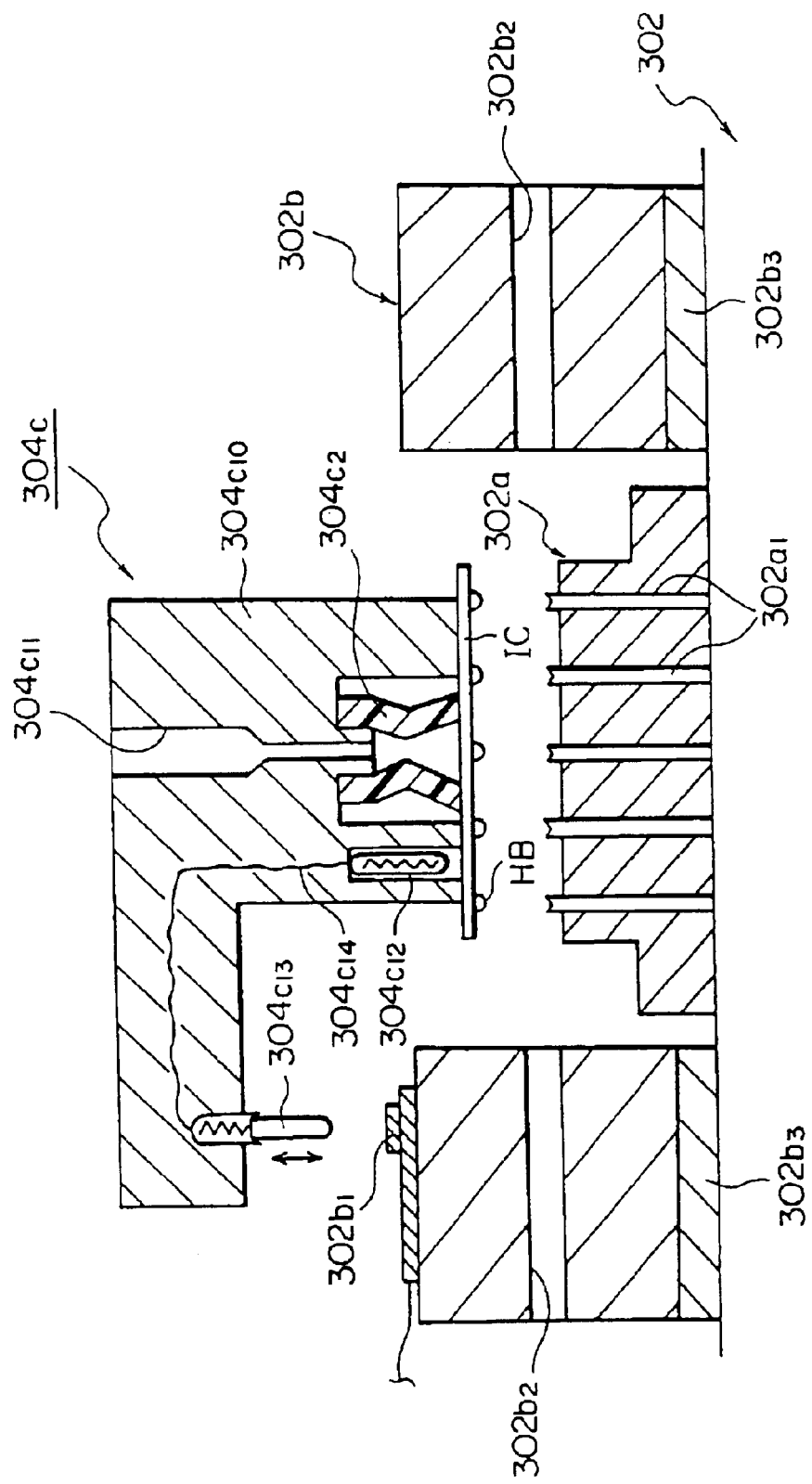
Figure 12:
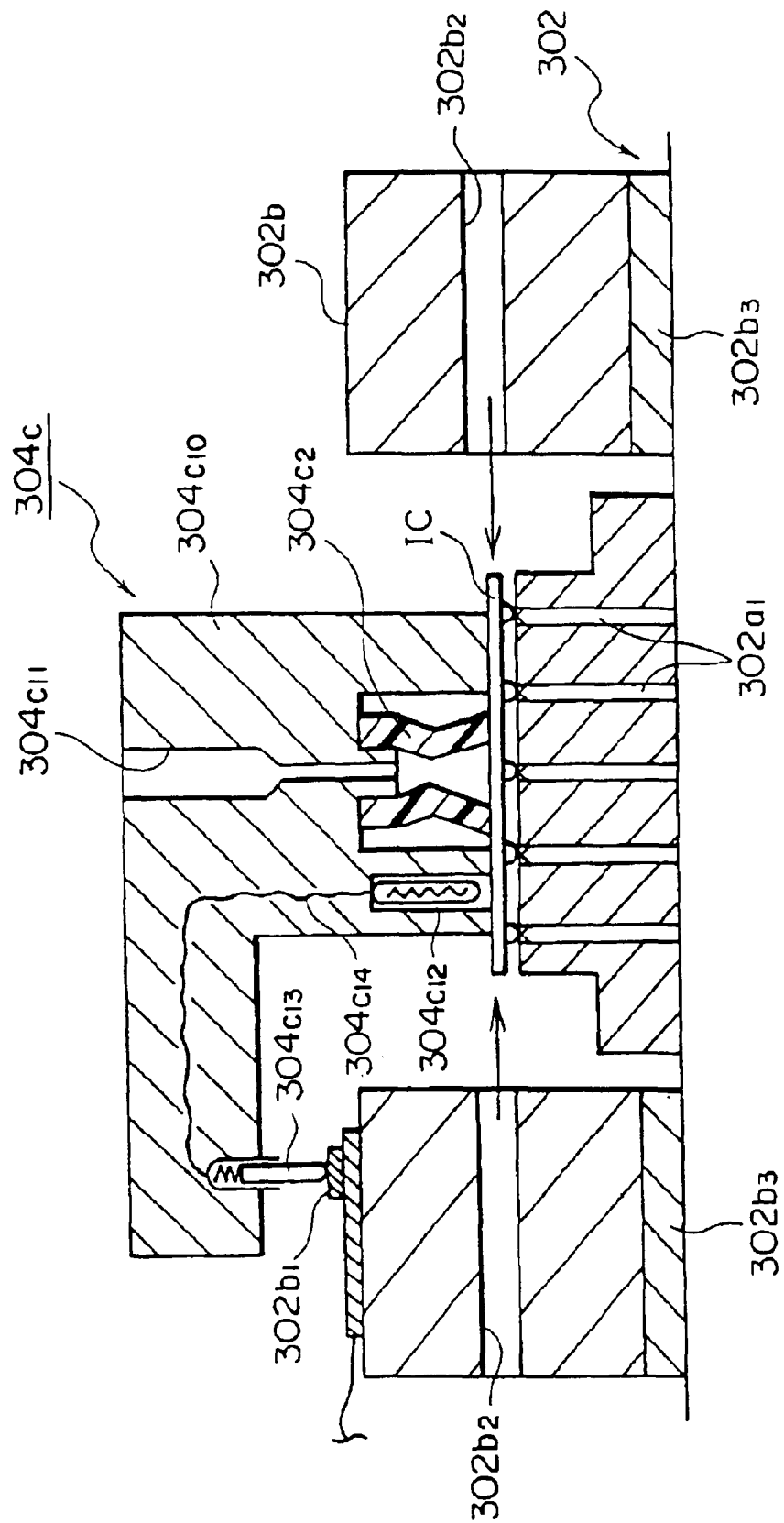

As shown in FIG. 11 and FIG. 12, in the device testing apparatus of the present embodiment, a suction head (pusher) 304c is attached to a not shown Z-axial direction drive unit. The suction head 304c has a pusher base moving up or down with respect to a contact portion 302a and a movable base attached to the pusher base through a floating mechanism. This movable base has secured to it a suction head body 304c10 having a suction pad 304c2 for picking up an IC chip.

The suction head body 304c10 secured to the movable base (not shown) is formed with a through hole 304c11 for evacuation of the inside. Further, a suction pad 304c2 comprised of rubber or another elastic member is secured to the inside of the suction head body 304c10. The suction force at the time of evacuation is imparted to the tip of the suction pad 304c2.

In particular, the suction head body 304c10 of the present embodiment has a temperature sensor 304c12 buried in it near the suction pad 304c2. The output side terminal 304c13 (hereinafter referred to as the "first terminal") is provided via the cable 304c14 exposed from the suction head body 304c10 toward the bottom. The first terminal 304c13 is comprised to be able to project or retract by a spring or other elastic member provided inside and is designed not to be damaged even if approaching and striking the later explained second terminal 302b1.

An air blower unit 302b comprised of a metal block is provided around the contact portion 302a of the test head 302. The air blower unit 302b has formed in it a cooling air passage 302b2 through which the cooling air is guided. The cooling air blown from the outlet of the cooling air passage, as shown in FIG. 12, flows toward the IC chip in the middle of the test from substantially straight at the side.

Note that a height adjustment block 302b3 is interposed between the air blower unit 302b and the test head 302. Even if the height positions of IC chips differ due to the different shapes of the contact portions 302a, by selecting the thickness of the height adjustment block 302b3, it is possible to blow the cooling air from straight laterally to the IC chips at all times. Due to this, it is possible to dissipate the heat generated during the testing of IC chips.

Further, a second terminal 302b1 is provided on the top surface of the air blower unit 302b at a position corresponding to the above first terminal 304c13. The output signal from the temperature sensor 304c12 is sent through the cable 304c14, first terminal 304c13, and second terminal 302b1 to a not shown controller.

When the solder ball terminals HB of an IC chip are pushed against the contact pins 302a1 of the contact portion 302a, the first terminal 304c13 contacts the second terminal 302b1, so the temperature sensor 304c12 is used to detect the temperature of the IC chip and send it to the not shown controller. The controller, receiving the temperature data, judges how much the temperature of the IC chip is off from the target temperature and, when higher in temperature, blows cooling air from the cooling air passage 302b2 as shown in FIG. 12 to cool the IC chip. Due to this, it is possible to cool an IC chip even if generating heat.

In the present embodiment, even if the temperature sensor 304c12 is provided at the suction head 304c, the cable of the temperature sensor 304c12 will not break due to movement of the suction head 304c and as a result it is possible to accurately measure the heat generated during a test.

In addition to this, it is possible to blow a sufficient amount of cooling air based on the measured temperature of the IC chip and, as a result, possible to prevent the electronic device from being destroyed or damaged by overheating, considered a particular problem in high temperature tests. Further, since the temperature rise due to heat generated is suppressed by blowing a fluid, not limited to high temperature tests, it is possible to conduct tests at the targeted accurate temperature, so the reliability of the test results is improved.

10th Embodiment

Figure 13:
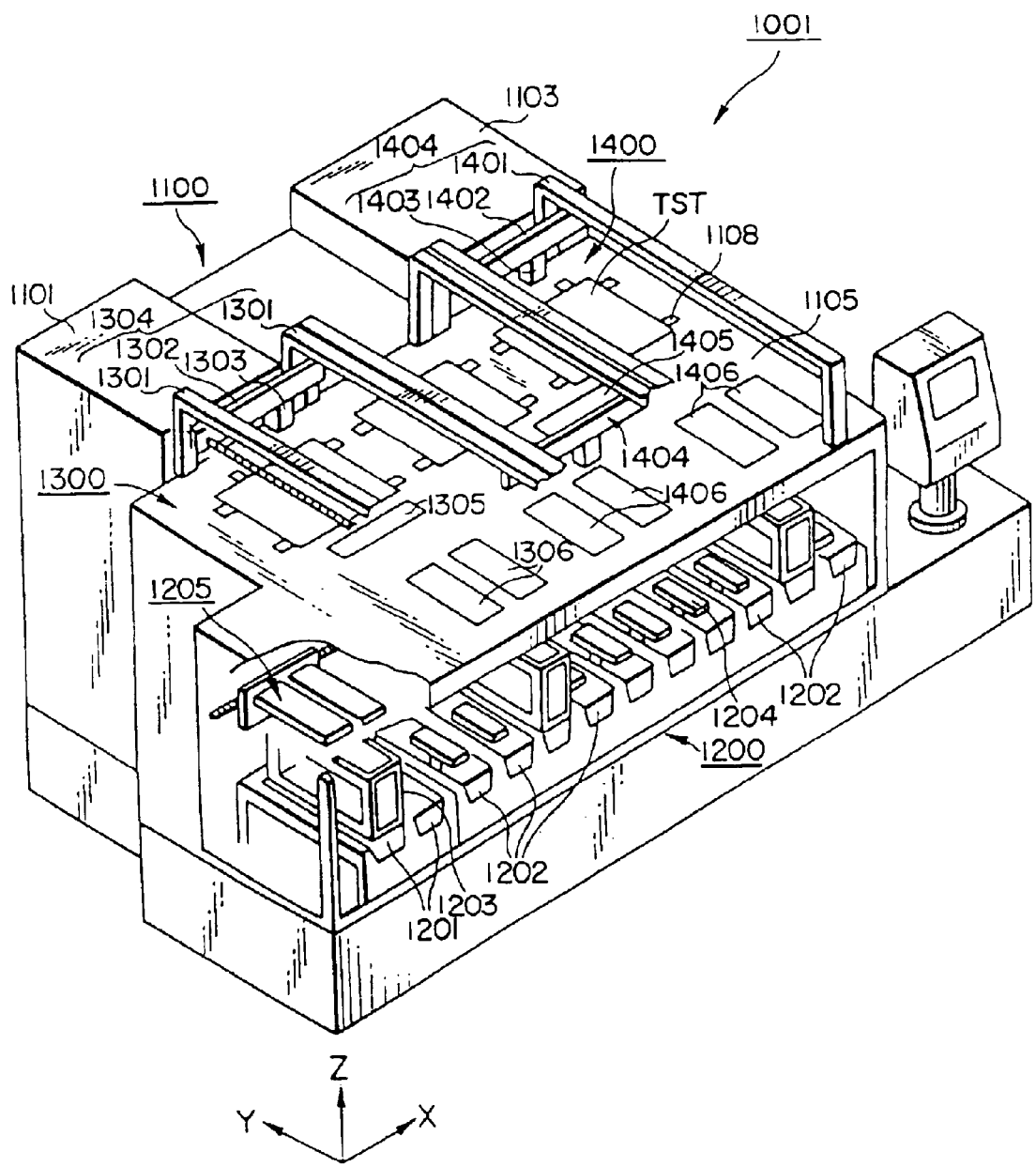
FIG. 13 is a schematic perspective view of an IC chip testing apparatus according to still another embodiment of the present invention.

As shown in FIG. 13, the device testing apparatus 1001 of the present embodiment tests (inspects) whether an IC is operating suitably in a state applying a high temperature or low temperature thermal stress to the IC chip and classifies the ICs in accordance with the test results. The operating test in the state with thermal stress applied is performed by reloading the IC chips from a tray carrying a large number of IC chips under test (hereinafter also called the "customer tray KST", not shown) to a test tray TST (see FIG. 15) conveyed through the inside of the device testing apparatus 1001.

Figure 14:
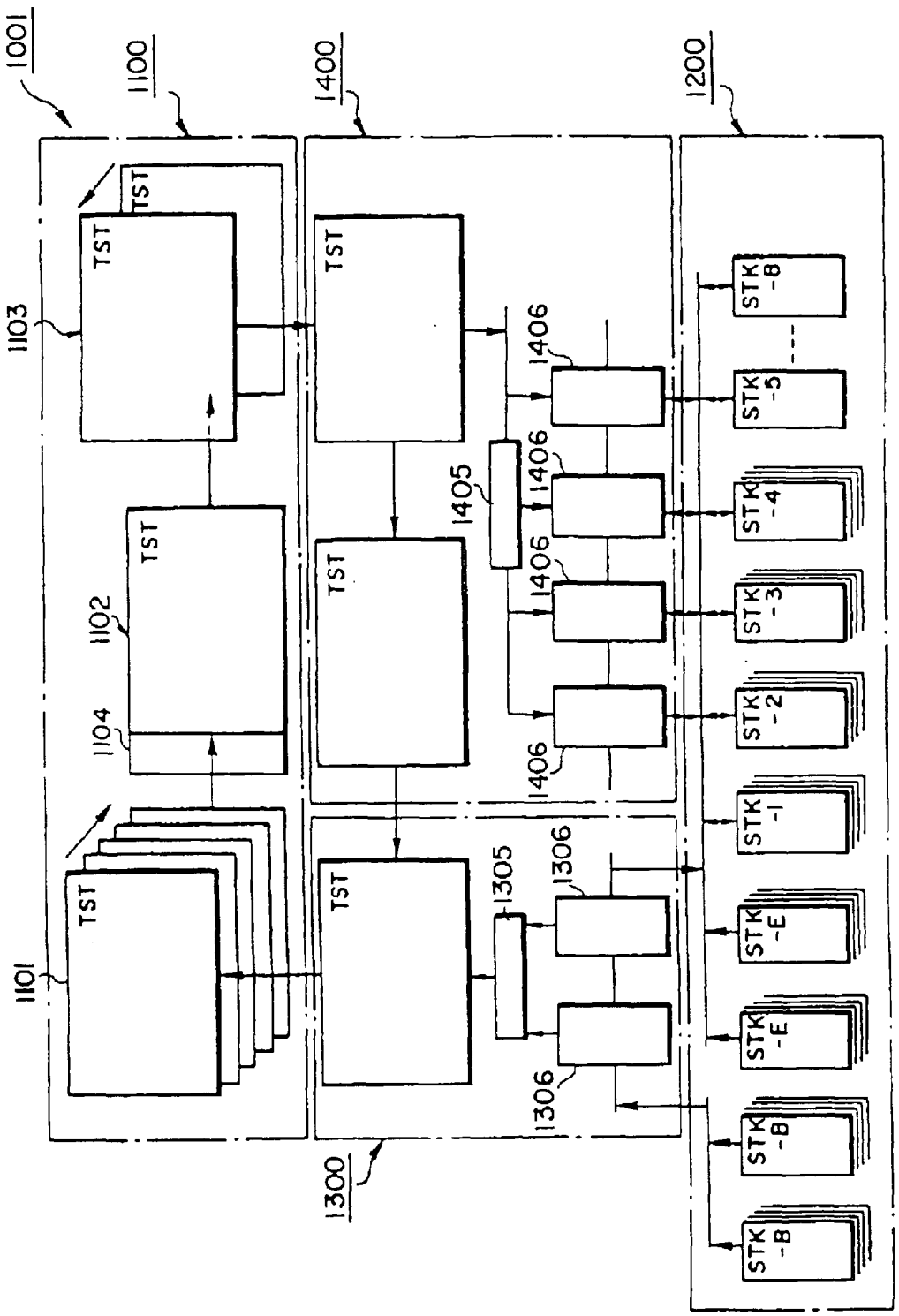
FIG. 14 is a schematic view of a method of handling an IC chip in a device testing apparatus shown in FIG. 13.

Therefore, the device testing apparatus 1001 of the present embodiment, as shown in FIG. 13 and FIG. 14, is comprised of an IC magazine 1200 which holds the IC chips to be tested or classifies and stores the tested IC chips, a loader section 1300 which sends the IC chips from the IC magazine 1200 into the chamber section 1100, a chamber section 1100 including a test head, and an unloader section 1400 classifying and taking out tested IC chips which had been tested in the chamber section 1100.

IC Magazine 1200

The IC magazine 1200 is provided with a pre-test IC stocker 1201 for holding IC chips to be tested and a post-test IC stocker 1202 for holding IC chips classified in accordance with the test results.

These pre-test IC stocker 1201 and post-test IC stocker 1202 are each comprised of a frame-shaped tray support frame 1203 and an elevator 1204 able to enter from under the tray support frame 1203 and move toward the top. The tray support frame 1203 supports in it a plurality of stacked customer trays KST. Only the stacked customer trays KST are moved up and down by the elevator 1204.

The pre-test IC stocker 1201 holds stacked customer trays KST on which the IC chips to be tested are held, while the post-test IC stocker 1202 holds stacked customer trays KST on which IC chips finished being tested are suitably classified.

Note that since the pre-test IC stocker 1201 and the post-test IC stocker 1202 are structured the same, the numbers of the pre-test IC stocker 1201 and the post-test IC stocker 1202 may be suitably set in accordance with need.

In the example shown in FIG. 13 and FIG. 14, the pre-test stocker 1201 is provided with two stockers STK-B and provided next to that with two empty stockers STK-E to be sent to the unloader section 1400, while the post-test IC stocker 1202 is provided with eight stockers STK-1, STK-2, . . . , STK-8 and can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 1300

The above-mentioned customer tray KST is conveyed from the lower side of the test board 1105 to a window 1306 of the loader section 1300 by a tray transfer arm 1205 provided between the IC magazine 1200 and test board 1105. Further, in the loader section 1300, the IC chips loaded on the customer tray KST are transferred once to a preciser 1305 by the X-Y-conveyor 1304. There, the mutual positions of the IC chips are corrected, then the IC chips transferred to the preciser 1305 are reloaded on the test tray TST stopped at the loader section 1300 using the X-Y conveyor 1304 again.

The IC conveyor 1304 reloading the IC chips from a customer tray KST to the test tray TST, as shown in FIG. 13, is provided with two rails 1301 laid over the top of the test board 1105, a movable arm 1302 able to move back and forth (this direction designated as the Y-direction) between the test tray TST and a customer tray KST by these two rails 1301, and a movable head 1303 supported by the movable arm 1302 and able to move in the X-direction along the movable arm 1302.

The movable head 1303 of the X-Y conveyor 1304 has suction heads attached facing downward. The suction heads move while drawing out air to pick up the IC chips from the customer tray KST and reload the IC chips on the test tray TST. For example, about eight suction heads are provided on the movable head 1303, so it is possible to reload eight IC chips at one time on the test tray TST.

Chamber Section 1100

The above-mentioned test tray TST is conveyed into the chamber section 1100 after being loaded with the IC chips by the loader section 1300, then the IC chips are tested in a state carried on the test tray TST.

The chamber section 1100 is comprised of a constant temperature chamber 1101 for giving a desired high temperature or low temperature thermal stress to the IC chips loaded on the test tray TST, a test chamber 1102 for making the IC chips contact the test head in a state given the thermal stress by the constant temperature chamber 1101, and a soak chamber 1103 for removing the given thermal stress from the IC chips tested in the test chamber 1102.

In the soak chamber 1103, when a high temperature was applied in the constant temperature chamber 1101, the IC chips are cooled-by blowing in air to return them to room temperature. Alternatively, when a low temperature of about −30° C. has been applied in the constant temperature chamber 1101, it heats the IC chips by hot air or a heater etc. to return them to a temperature where no condensation occurs. Next, the thus treated IC chips are conveyed out to the unloader section 1400.

As shown conceptually in FIG. 14, the constant temperature chamber 1101 is provided with a vertical conveyor. A plurality of test trays TST stand by supported by the vertical conveyor until the test chamber 1102 becomes empty. While standing by, a high temperature or low temperature thermal stress is applied to the IC chips.

The test chamber 1102 has a test head 1104 arranged at its center. A test tray TST is conveyed above the test head 1104 and the IC chips are tested by bringing their input-output terminals HB into electrical contact with the contact pins 151 of the test head 1104. On the other hand, the test tray TST finished being tested is treated in the soak chamber 1103 to return the temperature of the ICs to room temperature, then is ejected to the unloader section 1400.

The test board 1105 has a test tray conveyor 1108 mounted on it. The test tray TST ejected from the soak chamber 1103 by the test tray conveyor 1108 is returned to the constant temperature chamber 1101 through the unloader section 1400 and the loader section 1300.

Figure 15:
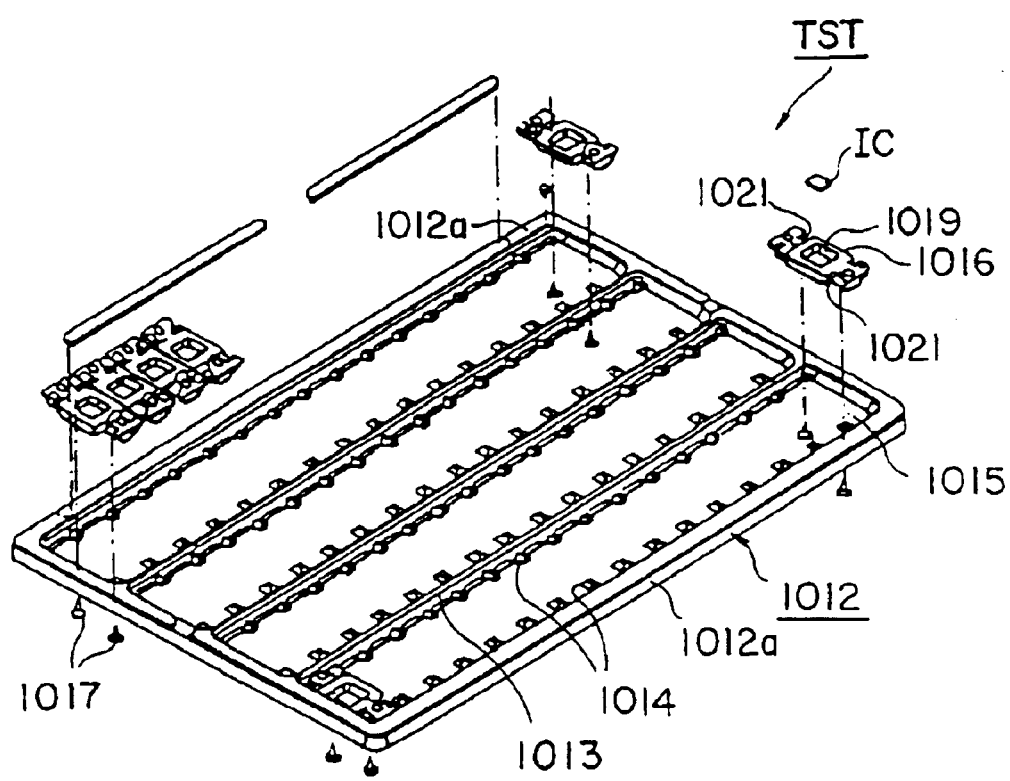
FIG. 15 is a disassembled perspective view of a test tray provided in the device testing apparatus shown in FIG. 13.

FIG. 15 is a disassembled perspective view of the structure of a test tray TST used in the present embodiment. The test tray TST is comprised of a rectangular frame 1012 provided with a plurality of crosspieces 1013 in parallel at equal intervals and has a plurality of mounting pieces 1014 formed projecting out at equal intervals at the two sides of these crosspieces and the sides 1012a of the frame 1012 facing the crosspieces. Insert holders 1015 are comprised between these crosspieces, between the crosspieces 1013 and the sides 1012a, and the two mounting pieces 1014.

The insert holders 1015 are designed to receive one insert 1016 each. An insert 1016 is attached to the two mounting pieces 1014 in a floating state using fasteners 1017. Therefore, mounting holes 1021 to the mounting pieces 1014 are formed at the two ends of the inserts 1016. For example, about 16×4 of these inserts 1016 are provided in one test tray TST.

Note that the inserts 1016 are made the same shape and same dimensions and that the IC chips are received in the inserts. The IC holder 1019 of the insert 1016 is determined by the shape of the IC chip to be received and in the example shown in FIG. 15 is made a rectangular indentation.

Here, if the IC chips once connected to the test head 1104 are arranged in four rows and 16 columns as shown in FIG. 15, then for example four rows of four columns of IC chips are simultaneously tested. That is, in the first test, the 16 IC chips arranged every fourth column from the first column are tested connected to the contact pins 1051 of the test head 1104. In the second test, the test tray TST is moved one column's worth and the IC chips arranged every fourth column from the second column are similarly tested. By doing this a total of four times, all of the IC chips are tested. The present invention, however, is not limited to this. There is no need to attach inserts 1016 to all of the columns and rows. It is possible to select the attachment positions of the inserts 1016 in accordance with the test specifications. The results of the test are stored at addresses determined by for example the identification number assigned to the test tray TST and the numbers of the IC chips assigned inside the test tray TST.

Figure 19:
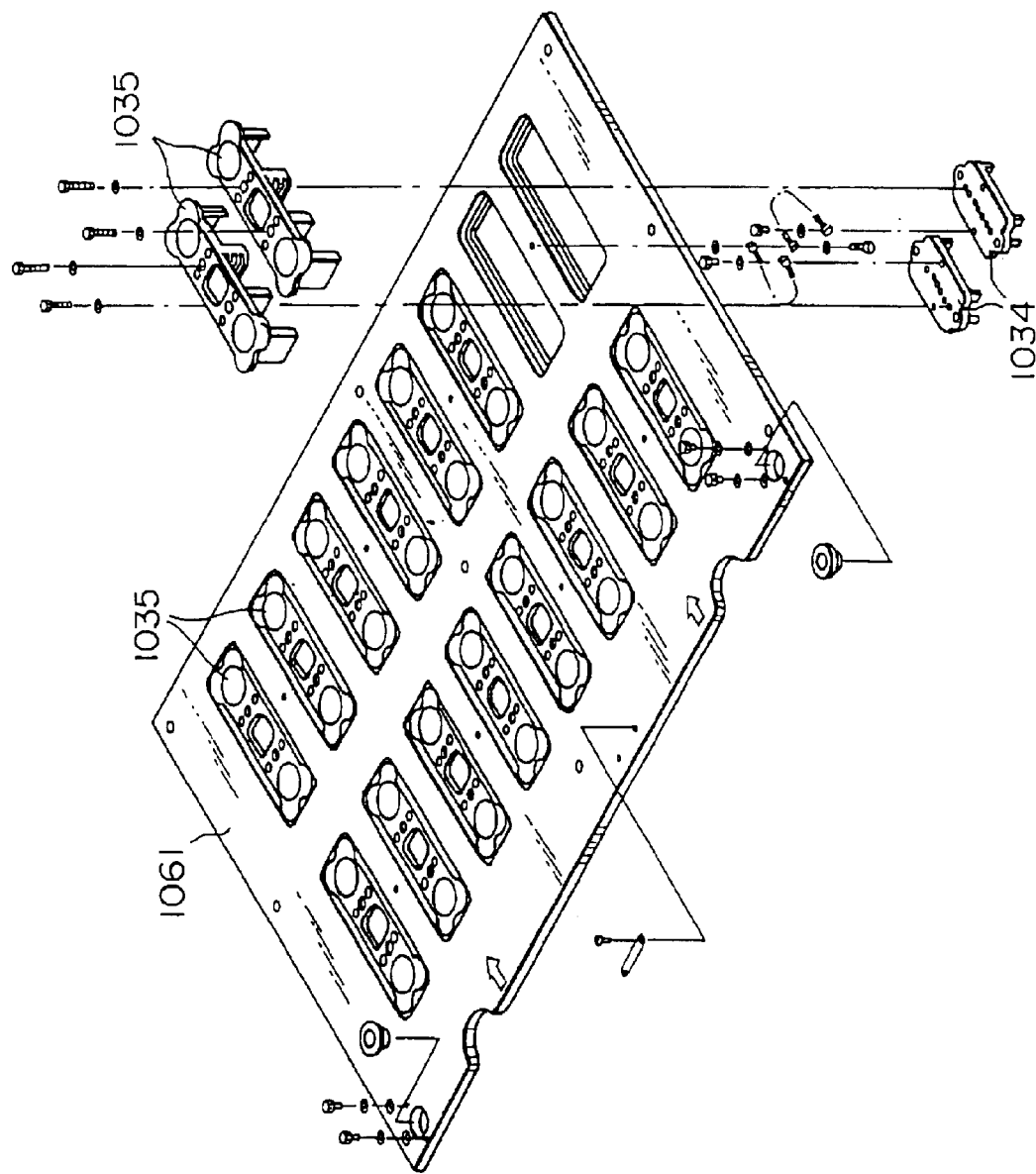
FIG. 19 is a disassembled perspective view of an example of a match plate.
Figure 20:
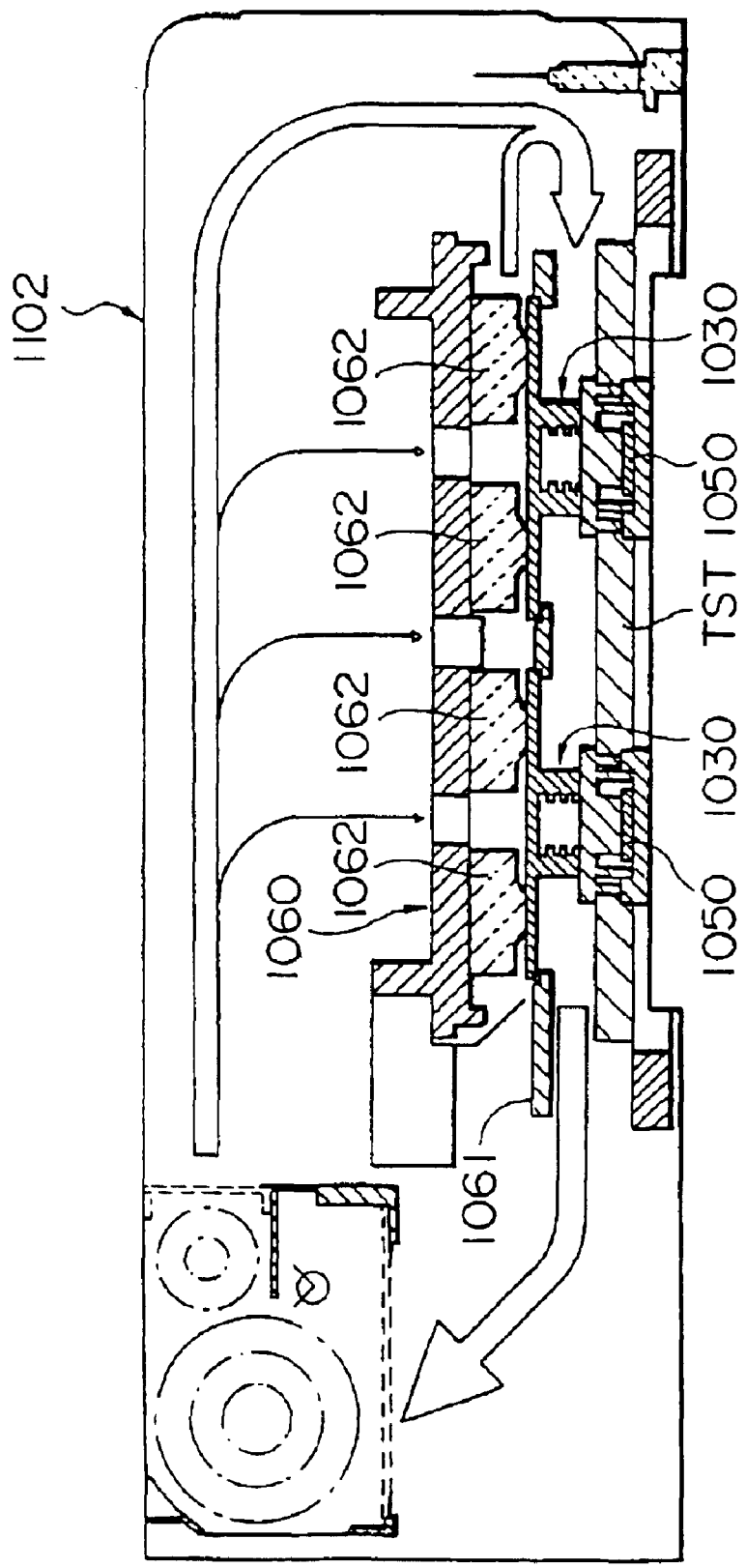
FIG. 20 is a sectional view of the structure of the inside of a test chamber.
Figure 21:
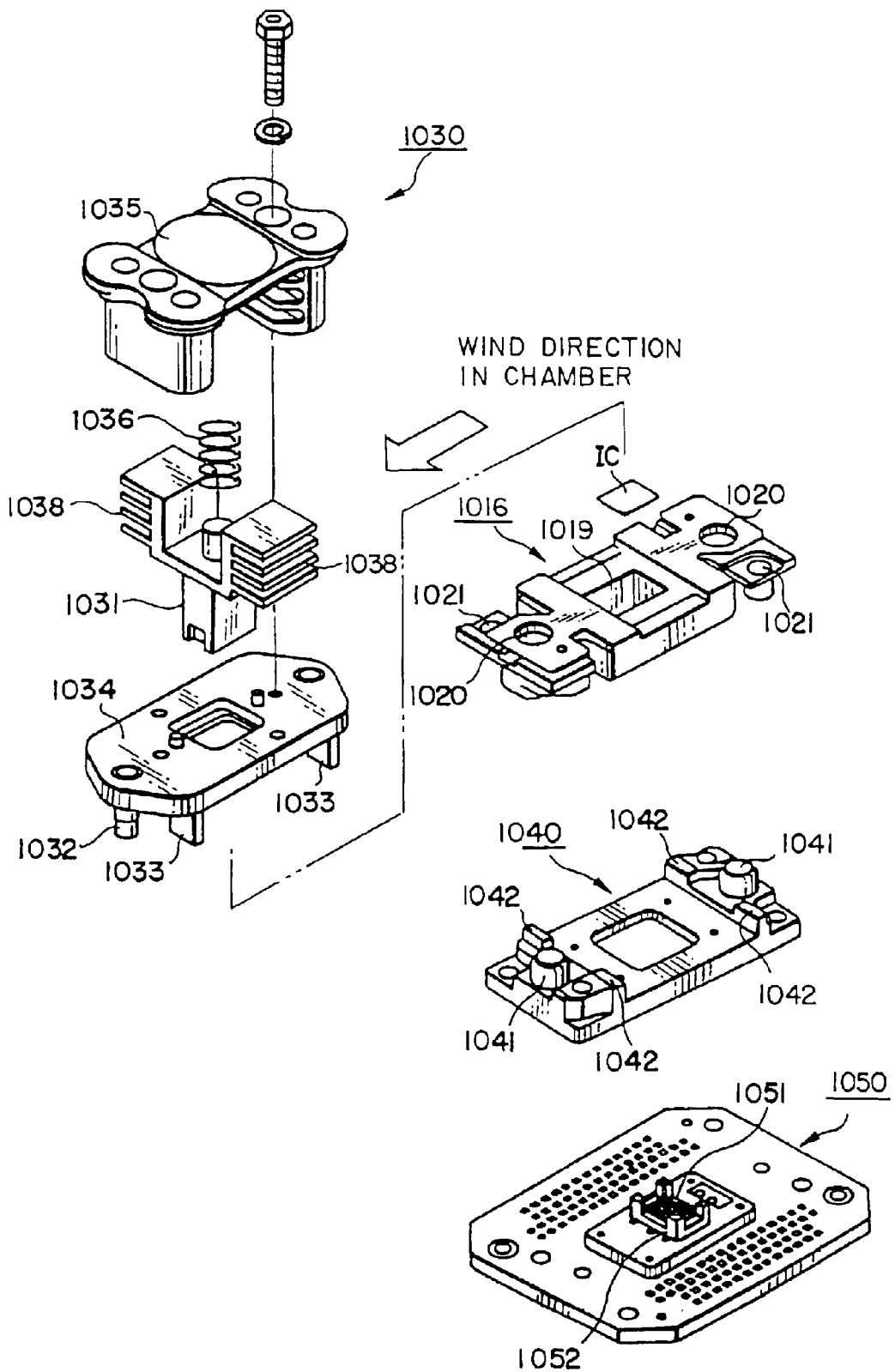
FIG. 21 is a disassembled perspective view of another embodiment of the present invention (corresponding to FIG. 16)

As shown in FIG. 20, a Z-axial drive (part of pusher) 1060 is provided at the top side of the test head 1104 and is moved vertically in the Z-direction by for example a fluid pressure cylinder. Match plates (part of pushers) 1061 shown in FIG. 19 are attached at the bottom side of the Z-axial drive 1060. The match plates 1061 are supported by the Z-axial drive 1060 so as to be raised and lowered along with the Z-axial drive 1060.

The match plate 1061 is provide with a pusher (part of pusher) 1030 shaped in accordance with the specifications of the IC chips corresponding to the intervals of the IC chips under test at one time as shown in FIG. 19.

Figure 17:
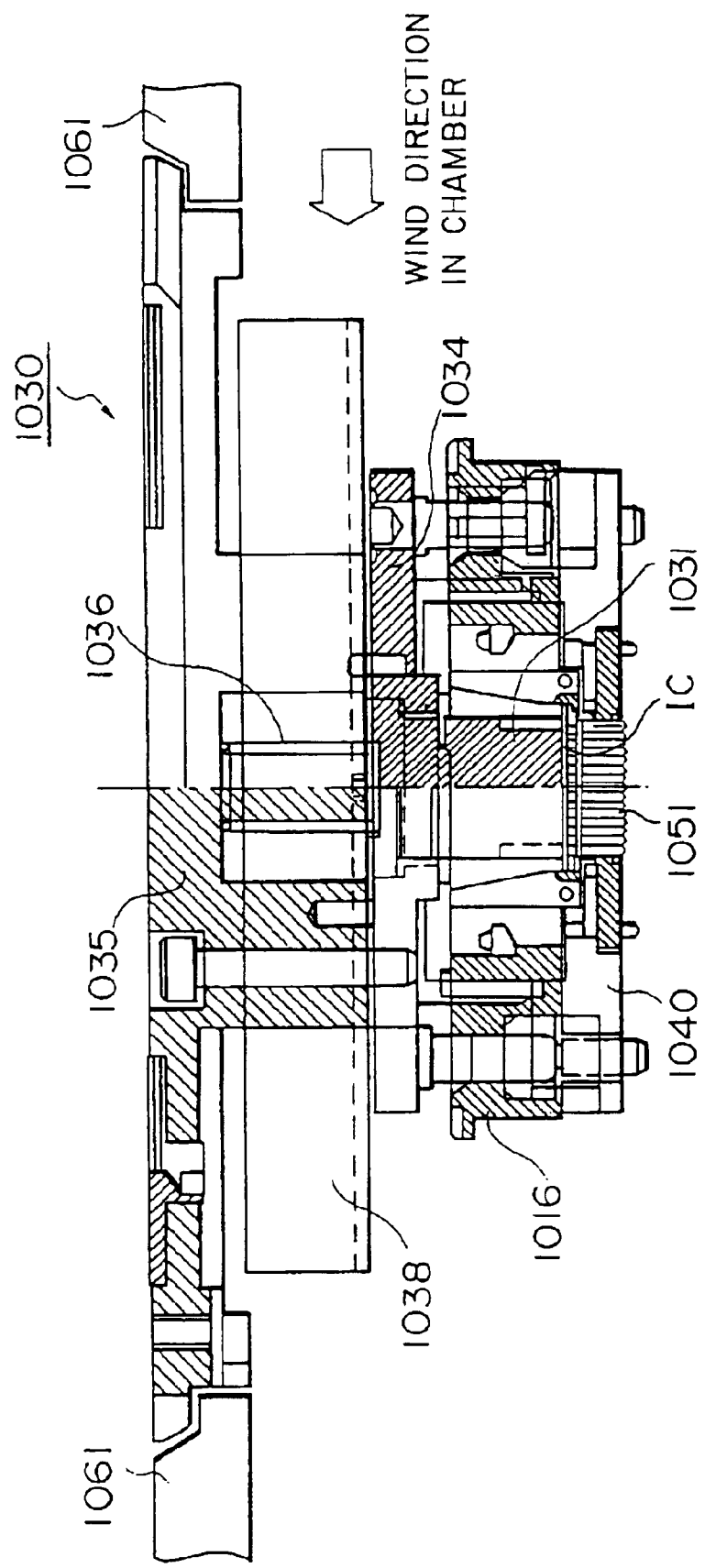
FIG. 17 is a sectional view of key portions along the line XVII—XVII shown in FIG. 16.

FIG. 16 and FIG. 17 show a pusher 1030. This pusher 1030 has a lead pusher base 1035 and pusher base 1034 attached to the above match plate 1061 and moving vertically in the Z-axial direction along with the Z-axial drive 1060 and a pusher block 1031 attached to the pusher base 1034 via two springs (corresponding to elastic members) 1036, 1036.

The lead pusher base 1035 and the pusher base 1034 are bolted as shown in FIG. 17. At the two sides of the pusher base 1034 are provided guide pins 1032 to be inserted into guide holes 1020 of the insert 1016 mentioned later and guide bushes 1041 of the socket guide 1040. Further, the pusher base 1034 is provided with stopper guides 1033 for limiting the descent of the pusher base 1034 along with the Z-axial drive 1060 as a lower limit. The stopper guides 1033 abut against the stopper surface 1042 of the socket guide 1040 to determine the standard dimensions of the lower limit position of the pusher for pushing by a suitable pressure not breaking the IC chip.

Figure 18:
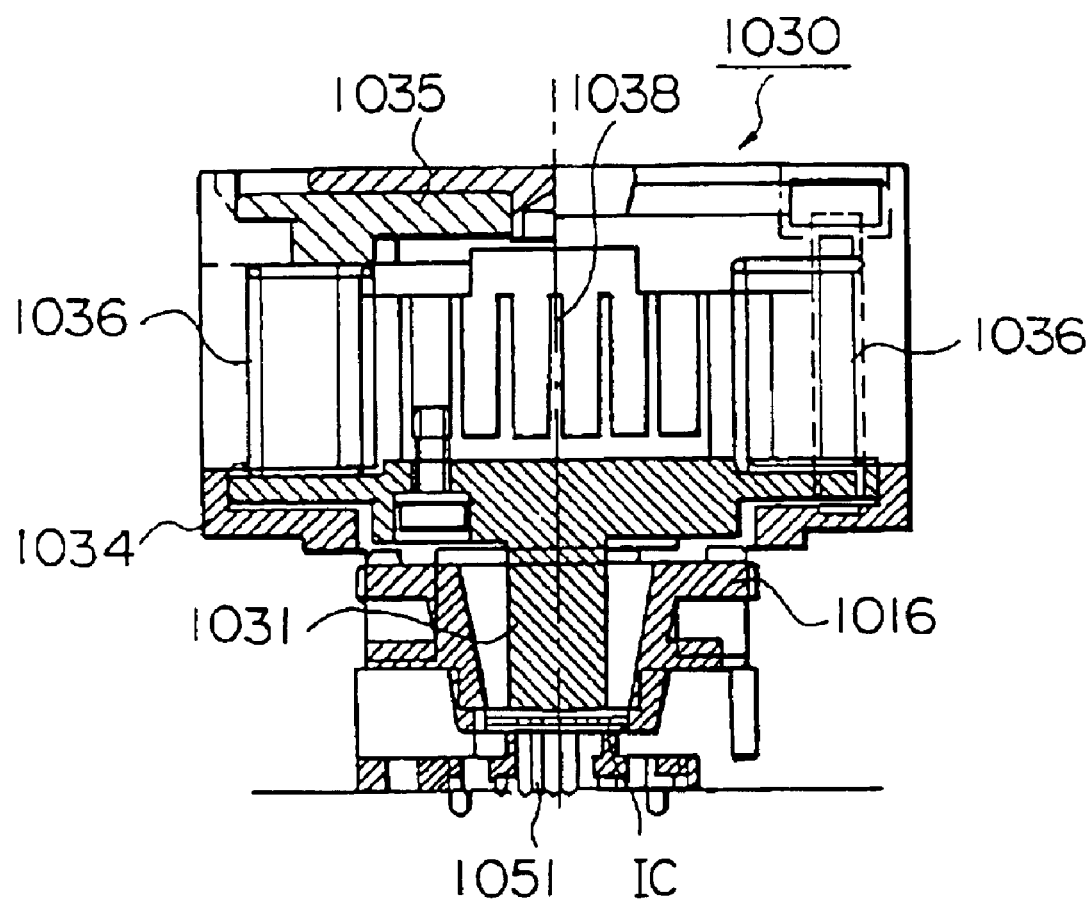
FIG. 18 is a sectional view of key portions along the line XVIII—XVIII shown in FIG. 16.

As shown in FIG. 17 and FIG. 18, the pusher block 1031 is for example made of aluminum or copper. It is inserted in a through hole made in the center of the pusher base 1034 with springs 1035, 1036 and, if necessary, shims (not shown) interposed with the lead pusher base 1035. The springs 1036, 1036 are compression springs (elastic members) giving a spring bias to the pusher block 1031 in the downward direction in the figure (direction going toward IC chip) and have elastic coefficients in accordance with a reference load on the IC chips.

The shim inserted in accordance with need along with the springs 1036 adjusts the reference length in the mounted state of the springs 1036 to adjust the initial load acting on the pusher block 1031. That is, even when using springs 1036 of the same elastic coefficient, the insertion of the shim makes the initial load acting on the pusher block 1031 larger. Note that it is sufficient to be able to adjust the standard length of the springs 1036, so the position of insertion of the shim may be between a spring 1036 and pusher block 1031 or between the lead pusher base 1035 and a spring 1036.

Between the two springs 1036, 1036 and on the top surface of the pusher block 1031 is secured for example an aluminum heat sink 1038 superior in heat conductivity. This heat sink 1038 abuts planarly against the top surface of the pusher block 1031 and is formed with heat radiating fins with large surface areas on its opposite side. The pusher block 1031 is made of aluminum or copper with superior heat conductivities and directly contacts the IC chip, so absorbs the heat generated by the ICs occurring during testing as it is. The heat conducted to the pusher block 1031 is absorbed by the heat sink 1038 and radiated to the surroundings from the heat radiating fins so as to prevent destruction or damage to the IC chips due to the heat generated by the IC chips or fluctuations in the temperature conditions.

The insert 1016, as explained also in FIG. 15, is attached to the test tray TST using a fastener 1017. It is formed at its two sides with guide holes 1020 through which the abovementioned guide pins 1032 of the pusher 1030 and the guide bushes 1041 of the socket guide 1040 are inserted. While a detailed illustration is omitted, for example the upper half of the guide hole 1020 at the left side is made a small diameter hole where the guide pin 1032 of the pusher base 1034 is inserted for positioning. The lower half of the guide hole 1020 is made a large diameter hole where the guide bush 1041 of the socket guide 1040 is inserted for positioning. Note that the guide hole 1020 at the right side in FIG. 17 fits loosely with the guide pin 1032 of the pusher base 1034 and the guide bush 1041 of the socket guide 1040.

As shown in FIG. 16 and FIG. 17, the insert 1016 is formed at its center with an IC holder 1019. By dropping the IC chip here, the IC chip is loaded on the test tray TST.

On the other hand, the socket guide 1040 fixed to the test head 1104 is provided at its two sides with guide bushes 1041 for insertion of the two guide pins 1032 of the pusher base 1034 and positioning with these two guide pins 1032. The guide bush 1041 at the left side also performs positioning with the insert 1016.

At the lower side of the socket guide 1040 is fixed a socket 1050 having a plurality of contact pins 1051. These contact pins 1051 are biased in the upward direction by not shown springs. Therefore, even if pushing an IC chip, the contact pins 1051 will retract to the top surface of the socket 1050. On the other hand, it is possible for the contact pins 1051 to contact all of the IC terminals even if the IC chip is pushed somewhat at an angle.

Unloader Section 1400

As shown in FIG. 13, the unloader section 1400 is provided with X-Y conveyors 1404, 1404 of the same structure as the X-Y conveyor 1304 provided at the loader section 1300. The X-Y conveyors 1404, 1404 reload the tested IC chips from the test tray TST carried out to the unloader section 1400 to the customer tray KST.

As shown in FIG. 13, the test board 1105 of the unloader section 1400 is provided with two pairs of windows 1406, 1406 arranged so that the customer trays KST carried to the unloader section 1400 can be brought close to the top surface of the test board 1105.

Further, while not illustrated, elevator tables for elevating or lowering customer trays KST are provided below the windows 1406. A customer tray KST becoming full after being reloaded with the tested IC chips is placed on there and lowered and the full tray is passed to the tray transfer arm 1205.

Note that in the device testing apparatus 1001 of the present embodiment, while there are a maximum of eight types of sortable categories, it is only possible to arrange a maximum of four customer trays KST at the windows 1406 of the unloader section 1400. To make up for this, a buffer section 1405 is provided between the test tray TST and the window 1406 of the unloader section 1400, and IC chips of a category rarely appearing are stored temporarily at this buffer section 1405.

The mode of operation will be explained next.

In the test process inside the chamber section 1100, the IC chips are conveyed to above the test head 1104 in the state carried on the test tray TST shown in FIG. 15, more specifically the individual IC chips are conveyed in the state dropped into the IC holders 1019 of the inserts 1016 of the figure.

When the test tray TST stops at the test head 1104, the Z-axial drive starts to operate and each pusher 1030 descends with respect to each insert 1016.

The two guide pins 1032, 1032 of the pushers 1030 formed at the bottom surface of the pusher base 1034 pass through the guide holes 1020, 1020 of the inserts 1016 and engage with the guide bushes 1041, 1041 of the socket guides 1040.

This state is shown in FIG. 17 and FIG. 18. The inserts 1016 and the pushers 1030 have a certain degree of positional error with respect to the sockets 1050 and socket guides 1040 fixed to the test head 1104 (that is, the device testing apparatus 1001 side). The guide pins 1032 of the left side of the pusher bases 1034 are fit into the small diameter holes of the guide holes 1020 of the inserts 1016 for positioning the pushers 1030 and the inserts 1016, so as a result it is possible for the pusher blocks 1031 attached to the pusher bases 1034 to push the IC chips at suitable positions in the X-Y direction.

Further, the large diameter holes of the guide holes 1020 at the left sides of the inserts 1016 engage with the guide bushes 1041 of the left sides of the socket guides 1040, whereby the inserts 1016 and the socket guides 1040 are positioned with respect to each other and whereby the positioning accuracy of the IC chips and the contact pins 1051 is improved in the X-Y direction.

Further, when the IC chips held by the IC holders 1019 of the inserts 1016 are pushed by the pushers 1030, they are drawn into the device guides 1052 provided at the socket 1050 or the socket guide 1040 for positioning, so positioning of the input-output terminals and contact pins 1051 in the X-Y direction can be realized with a high precision.

As opposed to this, for the Z-axial direction, the load acting on the IC chip when the stopper guide 1033 of the pusher base 1034 and the stopper surface 1042 of the socket guide 1040 abut becomes a problem. If too large, it leads to damage to the IC chip, while if too small, the test cannot be performed. Accordingly, it is necessary to precisely set the distance Y in the Z-axial direction between the stopper guide 1033 of the pusher base 1034 and the pusher block 1031 and the distance Z in the Z-axial direction between the contact pins 1051 and the stopper surface 1042 of the socket guide 1040. These is however a limit to this as well. Further, the thickness X of the IC chip itself has a large effect.

In the device testing apparatus 1001 of the present embodiment, however, the stroke of the pusher is not controlled. Rather, the load due to the pusher block 1031 is controlled, thereby enabling the pushing force on the IC chip to be made uniform. That is, even if errors $\Delta X$, $\Delta Y$, and $\Delta Z$ occur in the reference dimensions X, Y, and Z, the pusher block 1031 imparts elasticity to the IC chip due to the action of the springs 1036, 1036 and absorbs these errors. Therefore, it is possible to prevent an excessive pushing force from acting on the IC chip or conversely the pushing force from becoming insufficient.

Further, in addition to this load management, in the present invention, the pusher base 1031 is provided with a heat sink 1038, so even if an IC generates heat on its own during testing, the heat is absorbed by the heat sink 1038 and discharged from there to the surrounding environment, so it is possible to prevent destruction or damage of the IC due to overheating, considered a particular problem in high temperature tests. Further, since the temperature rise due to the heat generated is suppressed by the heat absorbing and radiating effect of the heat sink 1038, not only for high temperature tests, it is possible to test IC chips at the targeted accurate temperature and the reliability of the test results is improved.

Further, as shown in FIG. 16, FIG. 17, and FIG. 20, since the direction of the air acts well on the heat sink 1038 in the test chamber 1102, the heat radiating effect becomes better.

11th Embodiment

The device testing apparatus according to the present embodiment is substantially identical to the device testing apparatus 1001 according to the 10th embodiment, but differs in the number of ICs measured at the test head. Along with this, the shapes of the match plate 1061 and the pushers 1030 differ. Further, the shape of the heat sink 1038 provided at the pusher base 1031 differs.

Figure 22:
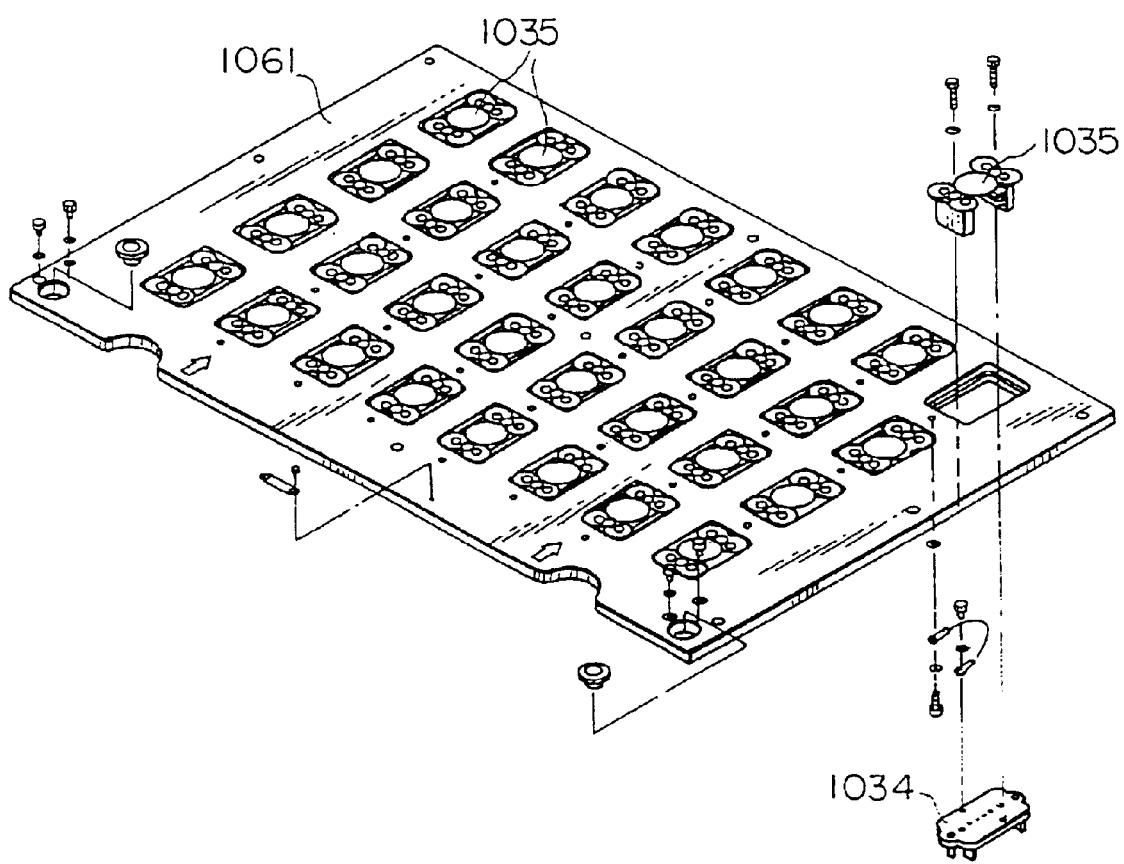
FIG. 22 is a disassembled perspective view of an example of a match plate of the embodiment shown in FIG. 21.
Figure 23:
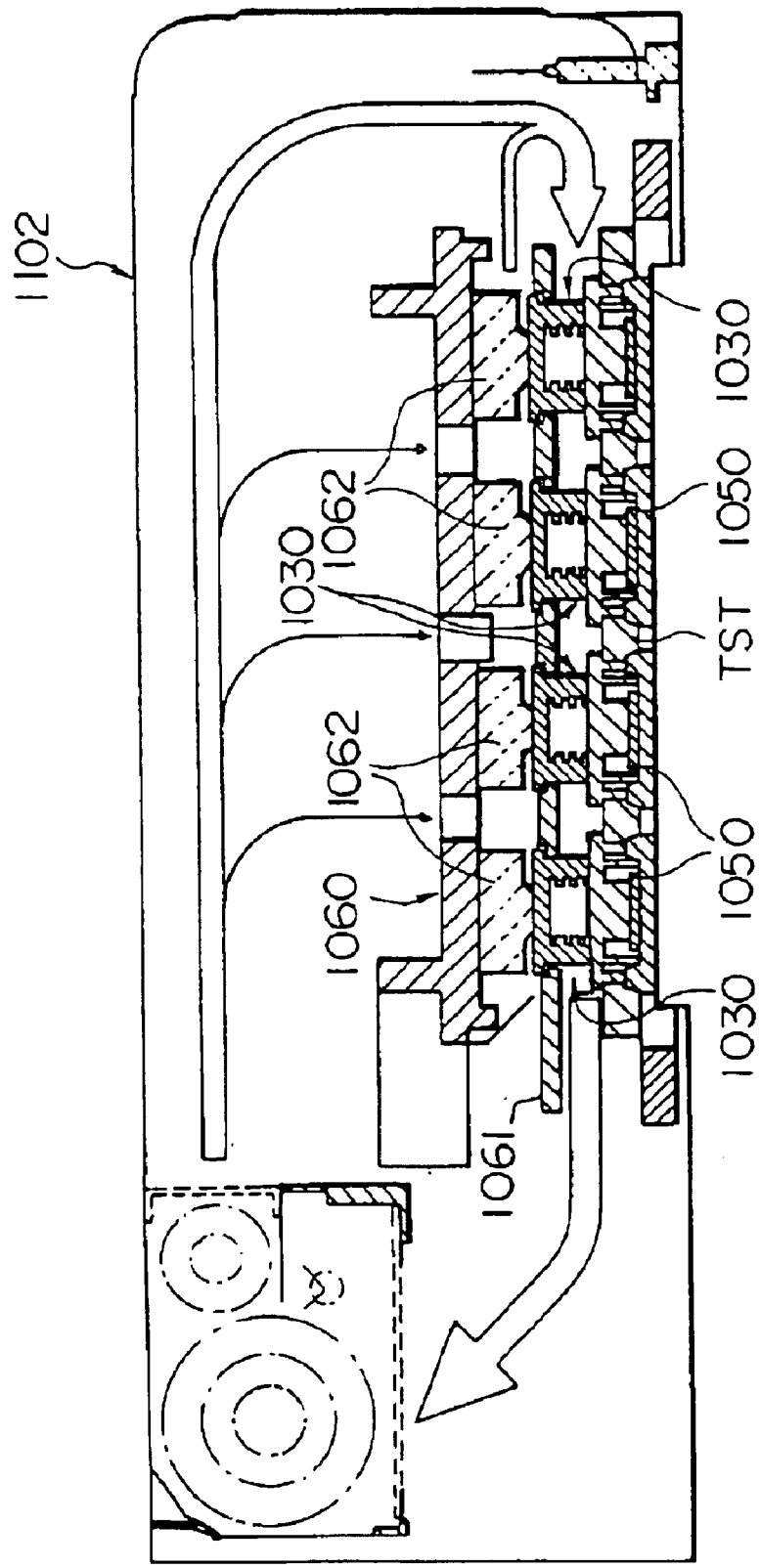
FIG. 23 is a sectional view of the structure of the inside of a test chamber of the embodiment shown in FIG. 21.

That is, while there were 2 rows×8 columns of ICs in the match plate 1061 of the 10th embodiment, there are 4 rows×8 columns of ICs in the present embodiment as shown in FIG. 22 and FIG. 23. Therefore, a pusher 1030 has to be made about half the size of that shown in FIG. 16, so the heat sinks 1038 are provided at the two sides of a spring 1036.

In this embodiment as well, the pusher block 1031 is made of aluminum or copper superior in heat conductivity and the IC chip is directly contacted with, so the heat generated by the IC caused during testing is absorbed as it is and the heat conducted to the pusher block 1031 is absorbed by the heat sink 1038. By dissipating this from the heat-radiating fins to the surroundings, it is possible to prevent the destruction or damage of an IC chip due to the heat generated by the IC or fluctuations in the temperature conditions.

12th Embodiment

Figure 24:
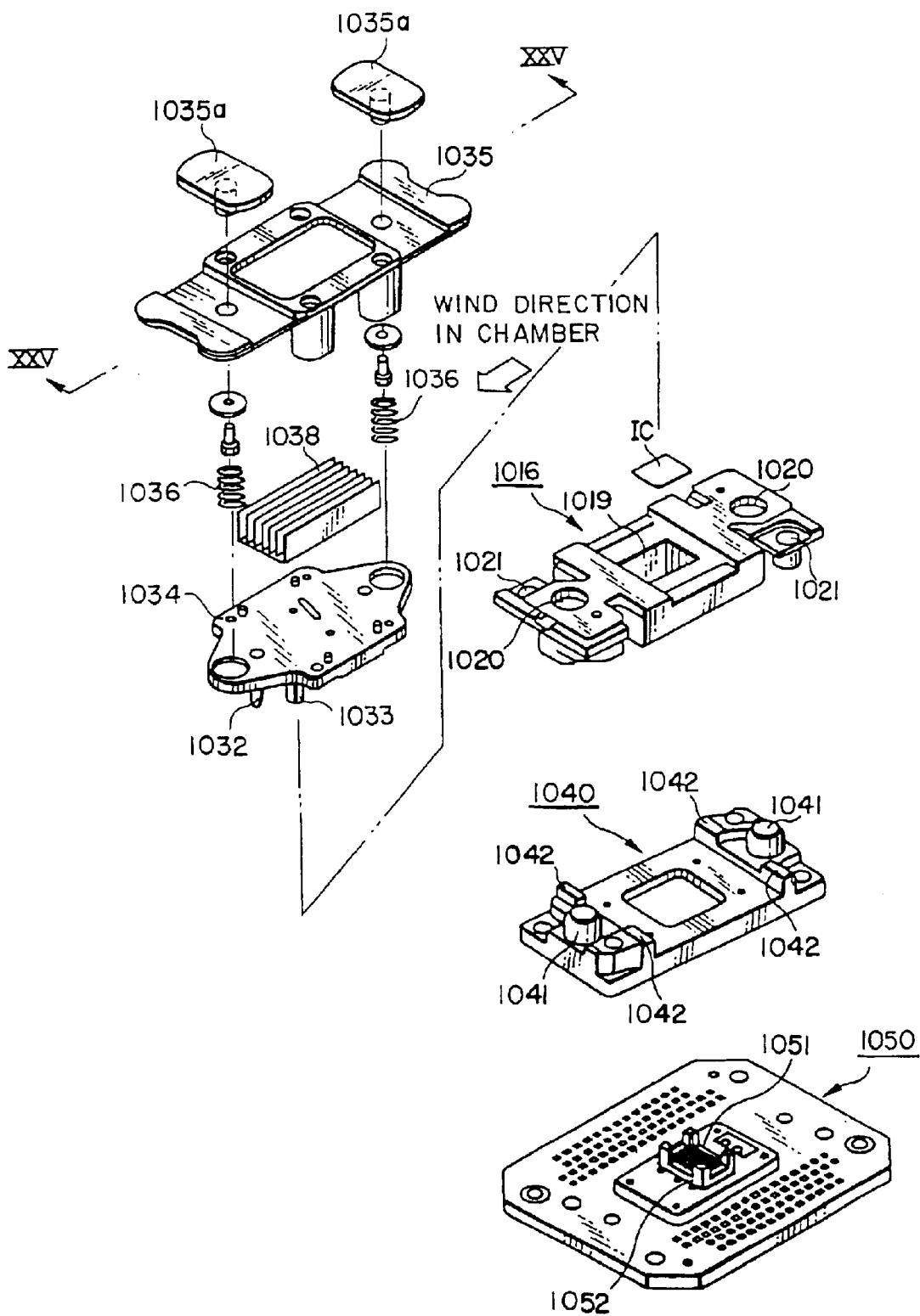
FIG. 24 is a disassembled perspective view of still another embodiment of the present invention.
Figure 25:
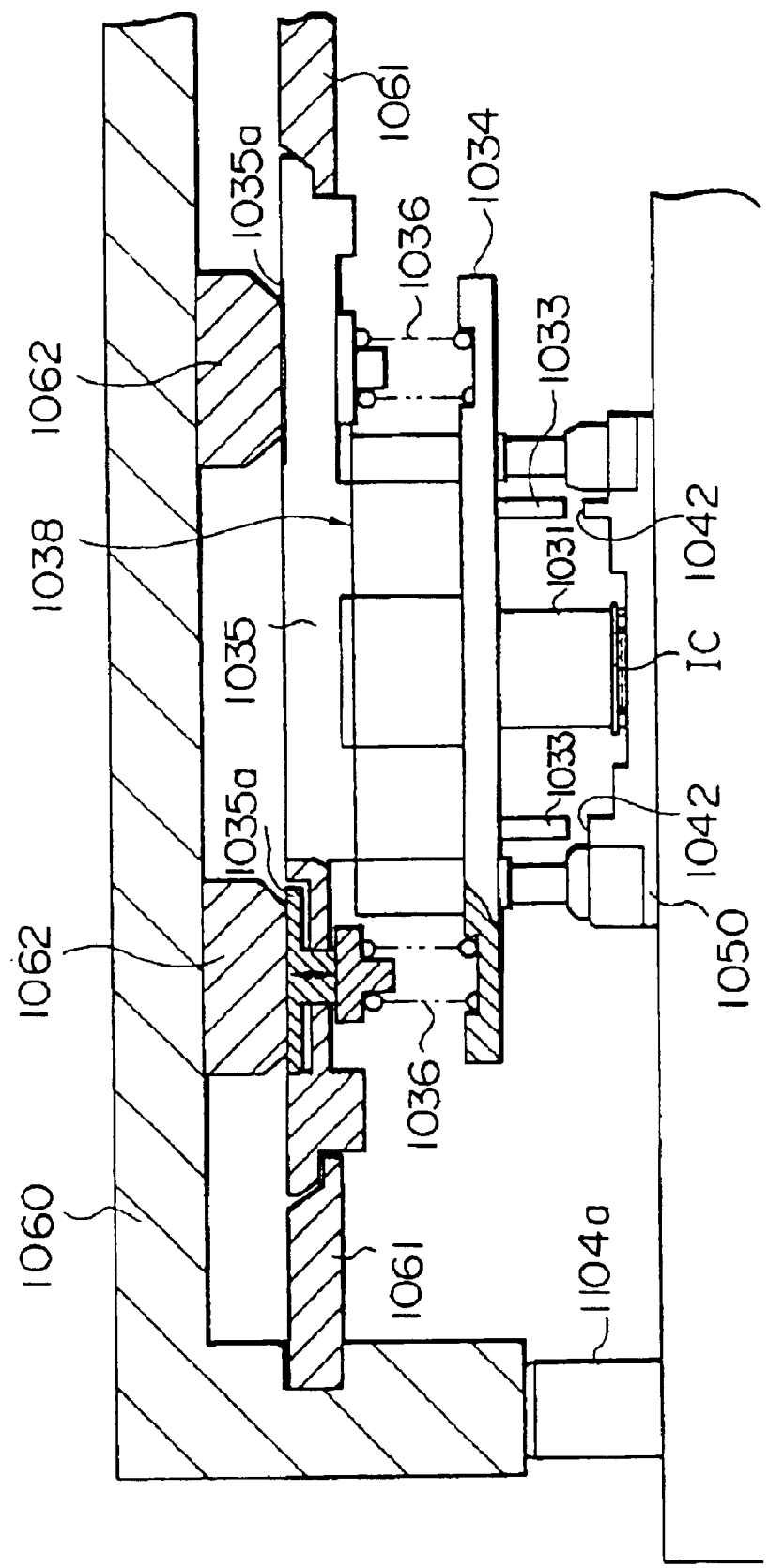
FIG. 25 is a sectional view along the line XXV—XXV of a test head portion of the embodiment shown in FIG. 24.

The device testing apparatus according to the present embodiment is substantially identical to the device testing apparatus 1001 according to the 10th embodiment, but as shown in FIG. 24 and FIG. 25, in the present embodiment, the pusher block 1031 is secured to the pusher base 1034 and, therefore, springs 1036, 1036 are interposed between the pusher 1035*a* of the lead pusher base 1035 and the pusher base 1034. That is, the pusher 1035*a* is designed to be able to move in the Z-axial direction with respect to the lead pusher base 1035.

Further, the dimensions are set so that, at the bottom dead point position of the Z-axial drive 1060, the stopper guide 1033 of the pusher base 1034 and the stopper surface 1042 of the socket guide 1040 do not abut. The bottom dead point position of the Z-axial drive 1060 is determined by the abutting of the frame of the Z-axial drive 1060 and the stopper post 1104*a* of the test head.

Therefore, if the Z-axial drive 1060 is made to descend and to push the pusher 1035*a* of the pusher base 1035 by its pusher 1062, the IC chip receives an upward force from the contact pin 1051 and receives a downward force due to the springs 1036. By adjusting the balance between the two, it is possible to adjust the load acting on the IC chip to a suitable value.

In this embodiment, the pusher block 1031 can be formed integrally with the pusher base 1034, so the heat sink 1038 is preferably attached to the top surface of the pusher base 1034. Due to this, the heat generated by the IC caused during testing is conducted through the pusher block 1031 and the pusher base 1034 to the heat sink 1038 and radiated off from there to the surroundings, so it is possible to prevent destruction or damage to the IC chip due to heat generated by the IC or fluctuations in the temperature conditions.

Note that the heat sink 1038 may be formed integrally with the pusher base 1034.

In particular, in the present embodiment, what contacts the IC chip are members with a large heat mass such as the pusher block 1031 and the pusher base 1034, so it is possible to sufficient dissipate the heat even if the IC chip is one with a remarkably large amount of heat buildup.

Further, in the present embodiment, for example, by interposing a Peltier element between the pusher block 1031 and the heat sink 1038 and sending a current of a predetermined direction in accordance with the IC temperature through the Peltier element, it is possible to realize suitable temperature control.

13th Embodiment

The overall configuration of the device testing apparatus of the present embodiment is substantially identical to that of the device testing apparatus 1001 according to the 10th embodiment, but differs in the following point.

Figure 26:
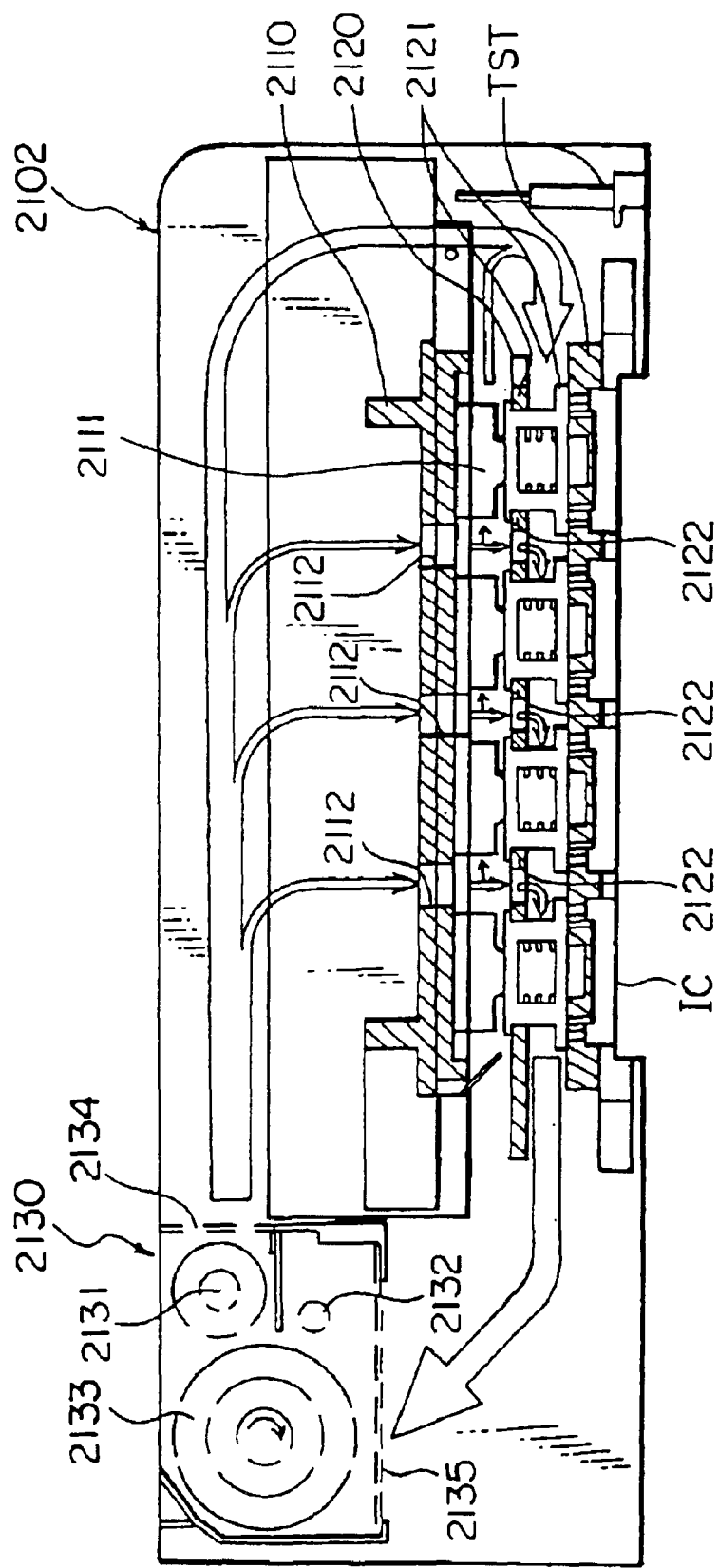
FIG. 26 is a sectional view of the inside of a chamber of a device testing apparatus according to another embodiment of the present invention.
Figure 27:
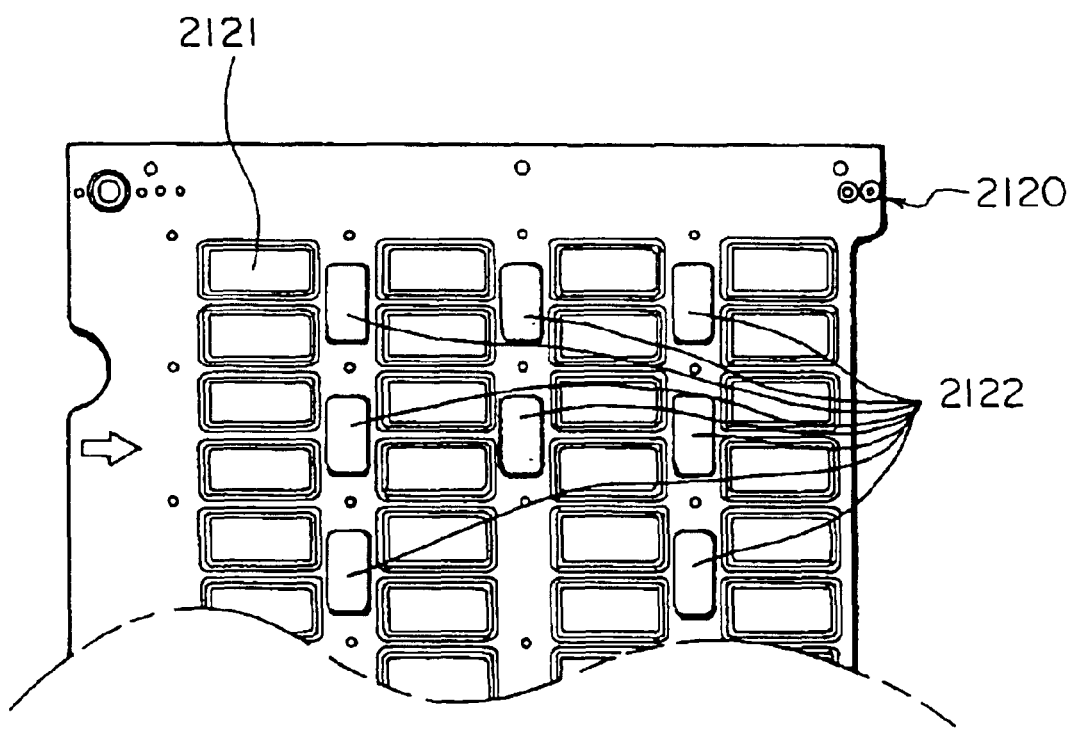
FIG. 27 is a plane view of key portions of the match plate shown in FIG. 26.

In the present embodiment, as shown in FIG. 27, a plurality of through holes 2122 (hereinafter referred to as second through holes) are formed in the pushers 2121 of the match plate 2120. Further, as shown in FIG. 26, a plurality of through holes 2112 (hereinafter referred to as first through holes) are formed at the position of the Z-axial drive 2110 positioned directly above the match plate 2120. The shapes, quantities, and positions of the first and second through holes 2112 and 2122 are not particularly limited. In the present embodiment, as shown in FIG. 27, one second through hole 2122 is formed so as to be surrounded by four pushers. 2121. The second through holes 2122 are formed so as to be positioned substantially equally in the match plate 2120 as a whole.

Further, as shown in FIG. 26, the top corner part of the test chamber 2102 (or to the soak chamber) is provided with a temperature application unit 2130. Inside of the unit 2130 are provided a heater 2131 for applying a high temperature, a blowing nozzle 2132 for liquid nitrogen for applying a low temperature, and a scroll fan 2133 for supplying hot air or cooling air inside of the chamber 2102. Further, the unit 2130 has formed with a feed port 2134 and intake port 2135 so that the hot air or cold air flows down as shown by the white arrow in the figure.

In this embodiment, a flow of hot air or cold air or other gas is fed from the temperature application unit 2130. When this flow of gas flows along the ceiling surface of the test chamber 2102 as shown in FIG. 26, part passes through the first through holes 2112 formed in the Z-axial drive 2110 and the second through holes 2122 formed in the match plate 2120 and blows on to the heat sink or IC chip directly. The rest of the flow of the gas sneaks around along the right side wall of the test chamber 102 and passes through the gap between the match plate 2120 and the test tray TST to return to the intake port 2135 of the unit 2130.

That is, in the device testing apparatus of the present embodiment, the hot air or cold air or other gas flow blown out from the feed port 2134 of the temperature application unit 2130 can be blown in parallel to the plurality of IC chips under test carried planarly, so the amount of heat supplied to the IC chips under test becomes uniform and the temperature elevation or reduction time for the plurality of IC chips under test becomes uniform. Due to this, it is possible to prevent uneven temperature from occurring even if 64 IC chips are carried and as a result possible to shorten the temperature elevation or reduction time. Further, it is possible to avoid unevenness of the temperature distribution due to heat generated by the IC chip.

14th Embodiment

The overall configuration of the device testing apparatus of this embodiment is substantially identical with that of the device testing apparatus 1001 according to the 10th embodiment, but differs in the following point.

Figure 28:
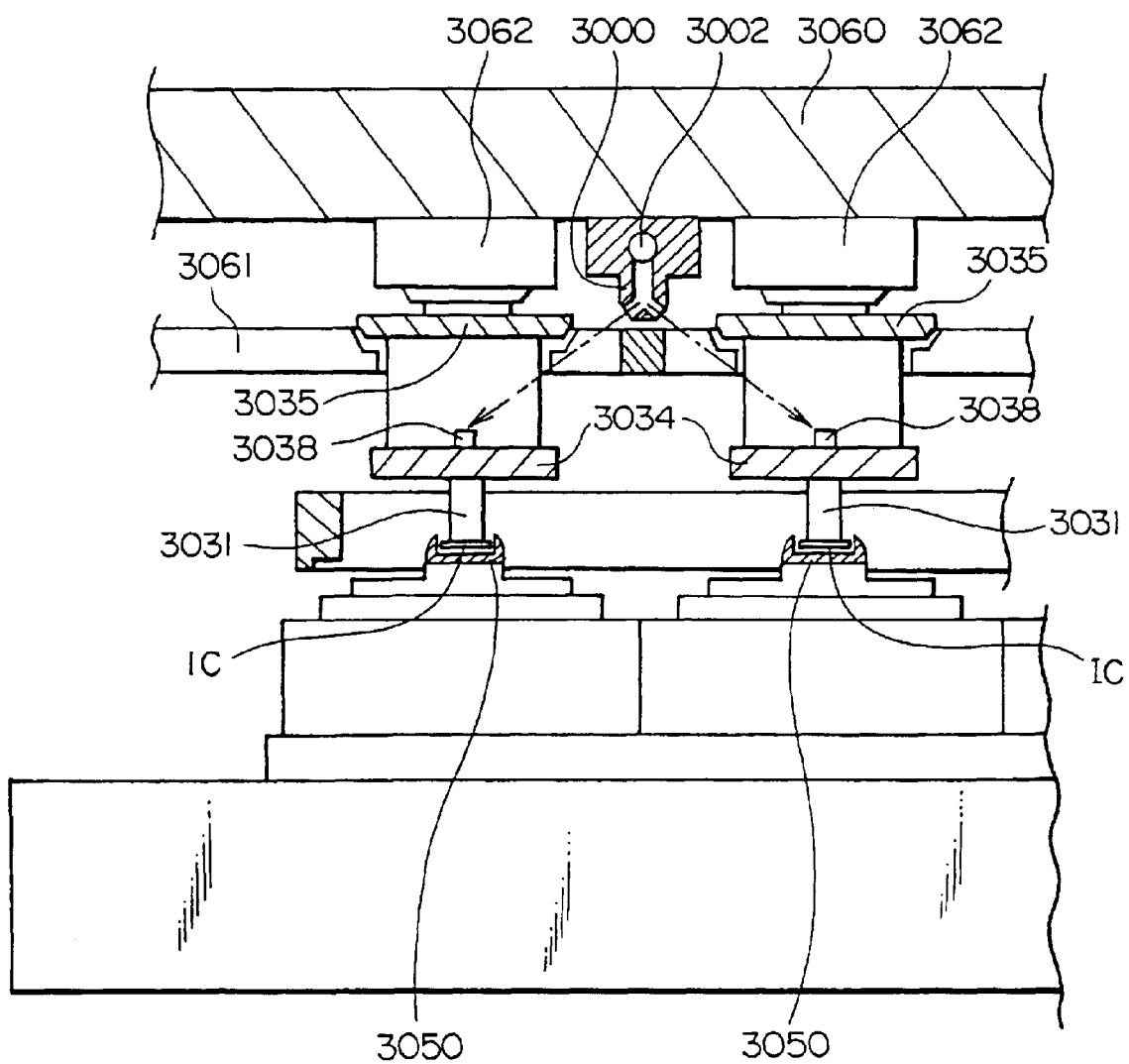
FIG. 28 is a sectional view of key portions of the device testing apparatus according to another embodiment of the present invention.

As shown in FIG. 28, in this embodiment, a nozzle 3000 is provided between the pair of pushers 3062 provided at the bottom surface of the Z-axial drive 3060. The nozzle 3000 is formed with a channel 3002 through which a temperature control gas (for example, cooling air) circulates and a pair of blowing ports. Temperature control gas is blown out from the blowing ports toward heat sinks 3038 provided on the pusher base 3034 connected to the lead pusher base 3035 held at the match plate 3061.

The temperature control gas may be a flow of gas of the same temperature as the flow of gas circulating in the chamber for maintaining the IC chips at the test temperature, but may also be a flow of gas of a different temperature. The temperature control gas is preferably cooling air for reducing the temperature rise due to the heat generated by the IC chip.

In this embodiment, in the same way as the 10th embodiment, the pusher block 3031 is comprised of aluminum or copper having a superior heat conductivity and directly contacts the IC chip held in the socket 3050. Therefore, the amount of heat due to the heat generated by the IC chip during a test is conducted to the pressure block 3031 and conveyed from there through the pusher base 3034 or directly to the heat sink 3038. The heat sink 3038 has temperature control gas (cooling air) blown on it from the blowing port of the nozzle 3000 and therefore is force-cooled. Accordingly, heat is rapidly dissipated from the heat-radiating fins of the heat sink 3038 and it is possible to effectively prevent the temperature of the IC chip from falling out of the test temperature range due to heat generated by the IC chip.

Note that the nozzle 3000 may also be provided at the match plate 3061 rather than the Z-axial drive 3060.

Other Embodiments

Note that the present invention is not limited to the above embodiments. Various modifications may be made within the scope of the present invention.

For example, the devices tested by the device testing apparatus of the present invention is not limited to an IC chip and may be other electronic devices as well.

What is claimed is:

1. A device tester comprising:
   a connection terminal to which an electronic device under test is detachably connected;
   a pusher for pushing the electronic device in the direction of the connection terminal so as to connect the electronic device to the connection terminal;
   a cooling unit attached to the pusher for cooling the electronic device, the cooling unit contacting the electronic device;
   a cooling fin, the cooling fin being attached to a sidewall of the pusher and being connected to the cooling unit;
   a temperature sensor for measuring a temperature of the electronic device; and
   a controller for controlling a cooling output of the cooling unit to cancel out heat generated by the electronic device during tests and maintain the electronic device constantly at a predetermined temperature on the basis of a temperature signal output by the temperature sensor.

2. The device tester as set forth in claim 1, further comprising a chamber for maintaining a predetermined ambient temperature of the connection terminal to which the electronic device is detachably attached.

3. The device tester as set forth in claim 1, wherein the cooling unit includes an element for cooling by electricity.

4. The device tester as set forth in claim 1, wherein the cooling unit includes a cooling medium blowing means for blowing a cooling medium around the electronic device.

5. The device tester as set forth in claim 1, wherein the cooling fin increases cooling efficiency by blowing the cooling medium.

6. The device tester as set forth in claim 5, wherein the cooling fin is a heat absorbing and radiating member.

7. The device tester as set forth in claim 1, wherein a plurality of sets of cooling fins are provided.

* * * * *